(12) United States Patent
Metzner et al.

(10) Patent No.: US 7,547,952 B2
(45) Date of Patent: Jun. 16, 2009

(54) METHOD FOR HAFNIUM NITRIDE DEPOSITION

(75) Inventors: Craig Metzner, Fremont, CA (US);
Shreyas Kher, Campbell, CA (US);
Yeong Kwan Kim, Pleasanton, CA (US); M. Noel Rocklein, Boulder, CO (US); Steven M. George, Boulder, CO (US)

(73) Assignee: Applied Materials, Inc., Santa Clara, CA (US)

( * ) Notice: Subject to any disclaimer, the term of this patent is extended or adjusted under 35 U.S.C. 154(b) by 238 days.

(21) Appl. No.: 11/420,928

(22) Filed: May 30, 2006

(65) Prior Publication Data
US 2006/0208215 A1 Sep. 21, 2006

Related U.S. Application Data

(62) Division of application No. 10/407,930, filed on Apr. 4, 2003.

(51) Int. Cl.
*H01L 29/72* (2006.01)
*H01L 21/3205* (2006.01)
*H01L 21/4763* (2006.01)
*H01L 21/31* (2006.01)
*H01L 21/469* (2006.01)
*H01L 21/10* (2006.01)
*H01L 21/26* (2006.01)

(52) U.S. Cl. .......................... 257/411; 257/410; 438/590; 438/763; 438/785; 438/786; 438/493

(58) Field of Classification Search .................. 428/698; 257/E21.422, E21.438, 410, 411; 423/69; 438/439, 493, 589, 590, 785, 786, 763
See application file for complete search history.

(56) References Cited

U.S. PATENT DOCUMENTS

| 4,058,430 A | 11/1977 | Suntola et al. |
| 4,389,973 A | 6/1983 | Suntola et al. |
| 4,413,022 A | 11/1983 | Suntola et al. |
| 4,415,275 A | 11/1983 | Dietrich |

(Continued)

FOREIGN PATENT DOCUMENTS

EP    0 464 515    1/1992

(Continued)

OTHER PUBLICATIONS

Visokay et al. Application of HfSiON as a gate dielectric material. Applied Physics Letters, vol. 80, No. 17. Apr. 29, 2002. p. 3183-3185.*

Shanware et al. Reliability of HfSiON gate dielectric film with 12.8 A SiO2 equivalent thickness. Electron Devices Meeting, 2001. IEDM Technical Digest, International. Aug. 7, 2002. p. 6.6.1-6.6.4.*

(Continued)

*Primary Examiner*—Karl E Group
*Assistant Examiner*—Noah S Wiese
(74) *Attorney, Agent, or Firm*—Patterson & Sheridan, LLP

(57) ABSTRACT

The present invention generally is a method for forming a high-k dielectric layer, comprising depositing a hafnium compound by atomic layer deposition to a substrate, comprising, delivering a hafnium precursor to a surface of the substrate, reacting the hafnium precursor and forming a hafnium containing layer to the surface, delivering a nitrogen precursor to the hafnium containing layer, forming at least one hafnium nitrogen bond and depositing the hafnium compound to the surface.

15 Claims, 7 Drawing Sheets

U.S. PATENT DOCUMENTS

| | | |
|---|---|---|
| 4,486,487 A | 12/1984 | Skarp |
| 4,693,208 A | 9/1987 | Sakai |
| 4,761,269 A | 8/1988 | Conger et al. |
| 4,834,831 A | 5/1989 | Nishizawa et al. |
| 4,975,252 A | 12/1990 | Nishizawa et al. |
| 4,993,357 A | 2/1991 | Scholz |
| 5,027,746 A | 7/1991 | Frijlink et al. |
| 5,173,327 A | 12/1992 | Sandhu et al. |
| 5,178,681 A | 1/1993 | Moore et al. |
| 5,225,366 A | 7/1993 | Yoder |
| 5,261,959 A | 11/1993 | Gasworth |
| 5,281,274 A | 1/1994 | Yoder |
| 5,290,609 A | 3/1994 | Horiike et al. |
| 5,294,286 A | 3/1994 | Nishizawa et al. |
| 5,306,666 A | 4/1994 | Izumi |
| 5,338,362 A | 8/1994 | Imahashi |
| 5,374,570 A | 12/1994 | Nasu et al. |
| 5,441,703 A | 8/1995 | Jurgensen |
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,521,126 A | 5/1996 | Okamura et al. |
| 5,674,786 A | 10/1997 | Turner et al. |
| 5,711,811 A | 1/1998 | Suntola et al. |
| 5,730,802 A | 3/1998 | Ishizumi et al. |
| 5,796,116 A | 8/1998 | Nakata et al. |
| 5,807,792 A | 9/1998 | Ilg et al. |
| 5,835,677 A | 11/1998 | Li et al. |
| 5,855,680 A | 1/1999 | Soininen et al. |
| 5,879,459 A | 3/1999 | Gadgli et al. |
| 5,916,365 A | 6/1999 | Sherman |
| 5,923,056 A | 7/1999 | Lee et al. |
| 5,972,430 A | 10/1999 | DiMeo, Jr. et al. |
| 6,013,553 A | 1/2000 | Wallace et al. |
| 6,015,590 A | 1/2000 | Suntola et al. |
| 6,020,243 A | 2/2000 | Wallace et al. |
| 6,025,627 A | 2/2000 | Forbes et al. |
| 6,042,652 A | 3/2000 | Hyun et al. |
| 6,043,177 A | 3/2000 | Falconer et al. |
| 6,060,755 A | 5/2000 | Ma et al. |
| 6,071,572 A | 6/2000 | Mosely et al. |
| 6,124,158 A | 9/2000 | Dautartas et al. |
| 6,139,700 A | 10/2000 | Kang et al. |
| 6,143,659 A | 11/2000 | Leem |
| 6,144,060 A | 11/2000 | Park et al. |
| 6,174,377 B1 | 1/2001 | Doering et al. |
| 6,174,809 B1 | 1/2001 | Kang et al. |
| 6,183,563 B1 | 2/2001 | Choi et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,302 B1 | 3/2001 | Sugiura et al. |
| 6,207,487 B1 | 3/2001 | Kim et al. |
| 6,231,672 B1 | 5/2001 | Choi et al. |
| 6,238,734 B1 | 5/2001 | Senzaki et al. |
| 6,270,572 B1 | 8/2001 | Kim et al. |
| 6,284,646 B1 | 9/2001 | Leem |
| 6,287,965 B1 | 9/2001 | Kang et al. |
| 6,291,283 B1 | 9/2001 | Wilk |
| 6,291,867 B1 | 9/2001 | Wallace et al. |
| 6,297,539 B1 | 10/2001 | Ma et al. |
| 6,299,294 B1 | 10/2001 | Regan |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,335,240 B1 | 1/2002 | Kim et al. |
| 6,342,277 B1 | 1/2002 | Sherman |
| 6,348,386 B1 | 2/2002 | Gilmer |
| 6,354,395 B1 | 3/2002 | Cheng et al. |
| 6,358,829 B2 | 3/2002 | Yoon et al. |
| 6,372,598 B2 | 4/2002 | Kang et al. |
| 6,391,785 B1 | 5/2002 | Satta et al. |
| 6,391,803 B1 | 5/2002 | Kim et al. |
| 6,395,650 B1 | 5/2002 | Callegari et al. |
| 6,399,208 B1 | 6/2002 | Baum et al. |
| 6,399,491 B2 | 6/2002 | Jeon et al. |
| 6,416,577 B1 | 7/2002 | Suntoloa et al. |
| 6,420,279 B1 | 7/2002 | Ono et al. |
| 6,432,283 B1 | 8/2002 | Fairlie et al. |
| 6,447,607 B2 | 9/2002 | Soininen et al. |
| 6,451,119 B2 | 9/2002 | Sneh et al. |
| 6,451,695 B2 | 9/2002 | Sneh |
| 6,452,229 B1 | 9/2002 | Krivokapic |
| 6,462,367 B2 | 10/2002 | Marsh et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,481,945 B1 | 11/2002 | Hasper et al. |
| 6,482,262 B1 | 11/2002 | Elers et al. |
| 6,489,214 B2 | 12/2002 | Kim et al. |
| 6,492,283 B2 | 12/2002 | Raaijmakers et al. |
| 6,511,539 B1 | 1/2003 | Raaijmakers |
| 6,534,395 B2 | 3/2003 | Werkhoven et al. |
| 6,551,406 B2 | 4/2003 | Kilpi |
| 6,572,705 B1 | 6/2003 | Suntola et al. |
| 6,578,287 B2 | 6/2003 | Aswad |
| 6,579,372 B2 | 6/2003 | Park |
| 6,593,484 B2 | 7/2003 | Yasuhara et al. |
| 6,599,572 B2 | 7/2003 | Saanila et al. |
| 6,607,973 B1 | 8/2003 | Jeon |
| 6,620,723 B1 | 9/2003 | Byun et al. |
| 6,630,030 B1 | 10/2003 | Suntola et al. |
| 6,630,201 B2 | 10/2003 | Chiang et al. |
| 6,632,279 B1 | 10/2003 | Ritala et al. |
| 6,632,747 B2 | 10/2003 | Niimi et al. |
| 6,660,126 B2 | 12/2003 | Nguyen et al. |
| 6,674,138 B1 | 1/2004 | Halliyal et al. |
| 6,716,287 B1 | 4/2004 | Santiago et al. |
| 6,718,126 B2 | 4/2004 | Lei |
| 6,734,020 B2 | 5/2004 | Lu et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,803,272 B1 | 10/2004 | Halliyal et al. |
| 6,815,285 B2 | 11/2004 | Choi et al. |
| 6,818,094 B2 | 11/2004 | Yudovsky |
| 6,821,563 B2 | 11/2004 | Yudovsky |
| 6,866,746 B2 | 3/2005 | Lei et al. |
| 6,868,859 B2 | 3/2005 | Yudovsky |
| 6,881,437 B2 | 4/2005 | Ivanov et al. |
| 6,902,624 B2 | 6/2005 | Seidel et al. |
| 6,921,062 B2 | 7/2005 | Gregg et al. |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0021589 A1 | 9/2001 | Wilk |
| 2001/0024387 A1 | 9/2001 | Raaijmakers et al. |
| 2001/0024871 A1 | 9/2001 | Yagi |
| 2001/0028924 A1 | 10/2001 | Sherman |
| 2001/0029092 A1 | 10/2001 | Park et al. |
| 2001/0029891 A1 | 10/2001 | Oh et al. |
| 2001/0034123 A1 | 10/2001 | Jeon et al. |
| 2001/0041250 A1 | 11/2001 | Werkhoven et al. |
| 2001/0042523 A1 | 11/2001 | Kesala |
| 2001/0042799 A1 | 11/2001 | Kim et al. |
| 2001/0050039 A1 | 12/2001 | Park |
| 2001/0054377 A1 | 12/2001 | Lindfors et al. |

| | | | | | | |
|---|---|---|---|---|---|---|
| 2001/0054730 A1 | 12/2001 | Kim et al. | | 2003/0022338 A1 | 1/2003 | Ruben et al. |
| 2002/0000196 A1 | 1/2002 | Park | | 2003/0031807 A1 | 2/2003 | Elers et al. |
| 2002/0000598 A1 | 1/2002 | Kang et al. | | 2003/0032281 A1 | 2/2003 | Werkhoven et al. |
| 2002/0005556 A1 | 1/2002 | Cartier et al. | | 2003/0042630 A1 | 3/2003 | Babcoke et al. |
| 2002/0007790 A1 | 1/2002 | Park | | 2003/0049931 A1 | 3/2003 | Byun et al. |
| 2002/0008297 A1 | 1/2002 | Park et al. | | 2003/0049942 A1 | 3/2003 | Haukka et al. |
| 2002/0009544 A1 | 1/2002 | McFeely et al. | | 2003/0053799 A1 | 3/2003 | Lei |
| 2002/0009896 A1 | 1/2002 | Sandhu et al. | | 2003/0057527 A1 | 3/2003 | Chung et al. |
| 2002/0014647 A1 | 2/2002 | Seidl et al. | | 2003/0060057 A1 | 3/2003 | Raaijmakers et al. |
| 2002/0015790 A1 | 2/2002 | Baum et al. | | 2003/0068437 A1 | 4/2003 | Nakamura et al. |
| 2002/0016084 A1 | 2/2002 | Todd | | 2003/0072913 A1 | 4/2003 | Chou et al. |
| 2002/0017242 A1 | 2/2002 | Hamaguchi et al. | | 2003/0072975 A1 | 4/2003 | Shero et al. |
| 2002/0021544 A1 | 2/2002 | Cho et al. | | 2003/0075273 A1 | 4/2003 | Kilpela et al. |
| 2002/0029092 A1 | 3/2002 | Gass | | 2003/0075925 A1 | 4/2003 | Lindfors et al. |
| 2002/0031618 A1 | 3/2002 | Sherman | | 2003/0079686 A1 | 5/2003 | Chen et al. |
| 2002/0041931 A1 | 4/2002 | Suntola et al. | | 2003/0082296 A1 | 5/2003 | Elers et al. |
| 2002/0043666 A1 | 4/2002 | Parsons et al. | | 2003/0082301 A1 | 5/2003 | Chen et al. |
| 2002/0047151 A1 | 4/2002 | Kim et al. | | 2003/0089308 A1 | 5/2003 | Raaijmakers |
| 2002/0048635 A1 | 4/2002 | Kim et al. | | 2003/0089942 A1 | 5/2003 | Bhattacharyya |
| 2002/0052097 A1 | 5/2002 | Park | | 2003/0096473 A1 | 5/2003 | Shih et al. |
| 2002/0064970 A1 | 5/2002 | Chooi et al. | | 2003/0101927 A1 | 6/2003 | Raaijmakers |
| 2002/0066411 A1 | 6/2002 | Chiang et al. | | 2003/0101938 A1 | 6/2003 | Ronsse et al. |
| 2002/0073924 A1 | 6/2002 | Chiang et al. | | 2003/0104710 A1 | 6/2003 | Visokay et al. |
| 2002/0074588 A1 | 6/2002 | Lee | | 2003/0106490 A1 | 6/2003 | Jallepally et al. |
| 2002/0076481 A1 | 6/2002 | Chiang et al. | | 2003/0109114 A1 | 6/2003 | Niwa |
| 2002/0076507 A1 | 6/2002 | Chiang et al. | | 2003/0113187 A1 | 6/2003 | Lei et al. |
| 2002/0076508 A1 | 6/2002 | Chiang et al. | | 2003/0116087 A1 | 6/2003 | Nguyen et al. |
| 2002/0076837 A1 | 6/2002 | Hujanen et al. | | 2003/0116804 A1 | 6/2003 | Visokay et al. |
| 2002/0081826 A1 | 6/2002 | Rotondaro et al. | | 2003/0121469 A1 | 7/2003 | Lindfors et al. |
| 2002/0081844 A1 | 6/2002 | Jeon et al. | | 2003/0121608 A1 | 7/2003 | Chen et al. |
| 2002/0086106 A1 | 7/2002 | Park et al. | | 2003/0129826 A1 | 7/2003 | Werkhoven et al. |
| 2002/0086111 A1 | 7/2002 | Byun et al. | | 2003/0133861 A1 | 7/2003 | Bowen et al. |
| 2002/0092471 A1 | 7/2002 | Kang et al. | | 2003/0140854 A1 | 7/2003 | Kilpi |
| 2002/0093046 A1 | 7/2002 | Moriya et al. | | 2003/0143328 A1 | 7/2003 | Chen et al. |
| 2002/0093781 A1 | 7/2002 | Bachhofer et al. | | 2003/0143747 A1 | 7/2003 | Bondestam et al. |
| 2002/0094689 A1 | 7/2002 | Park | | 2003/0160277 A1 | 8/2003 | Bhattacharyya |
| 2002/0098627 A1 | 7/2002 | Pomarede et al. | | 2003/0168750 A1 | 9/2003 | Basceri et al. |
| 2002/0104481 A1 | 8/2002 | Chiang et al. | | 2003/0172872 A1 | 9/2003 | Thakur et al. |
| 2002/0106451 A1 | 8/2002 | Skarp et al. | | 2003/0173586 A1 | 9/2003 | Moriwaki et al. |
| 2002/0106536 A1 | 8/2002 | Lee et al. | | 2003/0185980 A1 | 10/2003 | Endo |
| 2002/0108570 A1 | 8/2002 | Lindfors et al. | | 2003/0186495 A1 | 10/2003 | Saanila et al. |
| 2002/0110991 A1 | 8/2002 | Li | | 2003/0186561 A1 | 10/2003 | Law et al. |
| 2002/0115252 A1 | 8/2002 | Haukka et al. | | 2003/0188682 A1 | 10/2003 | Tois et al. |
| 2002/0115886 A1 | 8/2002 | Yasuhara et al. | | 2003/0189232 A1 | 10/2003 | Law et al. |
| 2002/0121241 A1 | 9/2002 | Nguyen et al. | | 2003/0190423 A1 | 10/2003 | Yang et al. |
| 2002/0121342 A1 | 9/2002 | Lu et al. | | 2003/0194493 A1 | 10/2003 | Chang et al. |
| 2002/0127745 A1 | 9/2002 | Lu et al. | | 2003/0194853 A1 | 10/2003 | Jeon |
| 2002/0134307 A1 | 9/2002 | Choi | | 2003/0198754 A1 | 10/2003 | Xi et al. |
| 2002/0144655 A1 | 10/2002 | Chiang et al. | | 2003/0205729 A1 | 11/2003 | Basceri et al. |
| 2002/0144657 A1 | 10/2002 | Chiang et al. | | 2003/0213560 A1 | 11/2003 | Wang et al. |
| 2002/0146511 A1 | 10/2002 | Chiang et al. | | 2003/0213987 A1 | 11/2003 | Basceri et al. |
| 2002/0146895 A1 | 10/2002 | Ramdani et al. | | 2003/0216981 A1 | 11/2003 | Tillman |
| 2002/0151152 A1 | 10/2002 | Shimamoto et al. | | 2003/0219942 A1 | 11/2003 | Choi et al. |
| 2002/0153579 A1 | 10/2002 | Yamamoto | | 2003/0221780 A1 | 12/2003 | Lei et al. |
| 2002/0155722 A1 | 10/2002 | Satta et al. | | 2003/0224107 A1 | 12/2003 | Lindfors et al. |
| 2002/0162506 A1 | 11/2002 | Sneh et al. | | 2003/0227033 A1 | 12/2003 | Ahn et al. |
| 2002/0168553 A1* | 11/2002 | Lee et al. ............ 428/697 | | 2003/0232501 A1 | 12/2003 | Kher et al. |
| 2002/0172768 A1 | 11/2002 | Endo et al. | | 2003/0232506 A1 | 12/2003 | Metzner et al. |
| 2002/0173130 A1 | 11/2002 | Pomerede et al. | | 2003/0232511 A1 | 12/2003 | Metzner et al. |
| 2002/0175393 A1 | 11/2002 | Baum et al. | | 2003/0234417 A1 | 12/2003 | Raaijmakers et al. |
| 2002/0177282 A1 | 11/2002 | Song | | 2003/0235961 A1 | 12/2003 | Metzner et al. |
| 2002/0182320 A1 | 12/2002 | Leskela et al. | | 2004/0005749 A1 | 1/2004 | Choi et al. |
| 2002/0187256 A1 | 12/2002 | Elers et al. | | 2004/0007747 A1 | 1/2004 | Visokay et al. |
| 2002/0187631 A1 | 12/2002 | Kim et al. | | 2004/0009307 A1 | 1/2004 | Koh et al. |
| 2002/0195643 A1 | 12/2002 | Harada | | 2004/0009675 A1 | 1/2004 | Eissa et al. |
| 2002/0196591 A1 | 12/2002 | Hujanen et al. | | 2004/0011404 A1 | 1/2004 | Ku et al. |
| 2002/0197881 A1 | 12/2002 | Ramdani et al. | | 2004/0011504 A1 | 1/2004 | Ku et al. |
| 2002/0197883 A1 | 12/2002 | Niimi et al. | | 2004/0013577 A1 | 1/2004 | Ganguli et al. |
| 2003/0004723 A1 | 1/2003 | Chihara | | 2004/0014320 A1 | 1/2004 | Chen et al. |
| 2003/0010451 A1 | 1/2003 | Tzu et al. | | 2004/0015300 A1 | 1/2004 | Ganguli et al. |
| 2003/0013320 A1 | 1/2003 | Kim et al. | | 2004/0016404 A1 | 1/2004 | Gregg et al. |
| 2003/0015764 A1 | 1/2003 | Raaijmakers et al. | | 2004/0016973 A1 | 1/2004 | Rotondaro et al. |
| 2003/0017697 A1 | 1/2003 | Choi et al. | | 2004/0018723 A1 | 1/2004 | Byun et al. |

| | | | | | | |
|---|---|---|---|---|---|---|
| 2004/0018747 | A1 | 1/2004 | Lee et al. | JP | 6-177381 | 6/1994 |
| 2004/0023461 | A1 | 2/2004 | Ahn et al. | JP | 06-196809 | 7/1994 |
| 2004/0023462 | A1 | 2/2004 | Rotondaro et al. | JP | 6-196809 | 7/1994 |
| 2004/0025370 | A1 | 2/2004 | Guenther et al. | JP | 06-224138 | 8/1994 |
| 2004/0028952 | A1 | 2/2004 | Cartier et al. | JP | 06-230421 | 8/1994 |
| 2004/0029321 | A1 | 2/2004 | Ang et al. | JP | 6-230421 | 8/1994 |
| 2004/0033698 | A1 | 2/2004 | Lee et al. | JP | 07-086269 | 3/1995 |
| 2004/0036111 | A1 | 2/2004 | Nishikawa et al. | JP | 7-86269 | 3/1995 |
| 2004/0038554 | A1 | 2/2004 | Ahn et al. | JP | 10-308283 | 11/1998 |
| 2004/0040501 | A1 | 3/2004 | Vaartstra | JP | 11-269652 | 10/1999 |
| 2004/0043149 | A1 | 3/2004 | Gordon et al. | JP | 2000-031387 | 1/2000 |
| 2004/0043569 | A1* | 3/2004 | Ahn et al. ............ 438/287 | JP | 2000-31387 | 1/2000 |
| 2004/0043630 | A1 | 3/2004 | Vaarstra et al. | JP | 2000-58777 | 2/2000 |
| 2004/0046197 | A1 | 3/2004 | Basceri et al. | JP | 2000-058777 | 2/2000 |
| 2004/0048491 | A1 | 3/2004 | Jung et al. | JP | 2000-212752 | 8/2000 |
| 2004/0051152 | A1 | 3/2004 | Nakajima | JP | 2000-319772 | 11/2000 |
| 2004/0053484 | A1 | 3/2004 | Kumar et al. | JP | 2001-020075 | 1/2001 |
| 2004/0065255 | A1 | 4/2004 | Yang et al. | JP | 2001-111000 | 4/2001 |
| 2004/0069227 | A1 | 4/2004 | Ku et al. | JP | 2001-172767 | 6/2001 |
| 2004/0071897 | A1 | 4/2004 | Verplancken et al. | JP | 2001-220294 | 8/2001 |
| 2004/0077182 | A1 | 4/2004 | Lim et al. | JP | 2001-328900 | 11/2001 |
| 2004/0144308 | A1 | 7/2004 | Yudovsky | JP | 2002-000513 | 1/2002 |
| 2004/0144311 | A1 | 7/2004 | Chen et al. | JP | 2002-060944 | 2/2002 |
| 2004/0203254 | A1 | 10/2004 | Conley, Jr. et al. | JP | 2002-60944 | 2/2002 |
| 2004/0216670 | A1 | 11/2004 | Gutsche et al. | JP | 2002-069641 | 3/2002 |
| 2004/0219784 | A1 | 11/2004 | Kang et al. | JP | 2002-69641 | 3/2002 |
| 2004/0224506 | A1 | 11/2004 | Choi et al. | JP | 2002-093801 | 3/2002 |
| 2004/0235285 | A1 | 11/2004 | Kang et al. | JP | 2002-93804 | 3/2002 |
| 2005/0006799 | A1 | 1/2005 | Gregg et al. | JP | 2002-167672 | 6/2002 |
| 2005/0059240 | A1 | 3/2005 | Choi et al. | JP | 2002-172767 | 6/2002 |
| 2005/0064207 | A1 | 3/2005 | Senzaki et al. | WO | WO 96/17107 | 6/1996 |
| 2005/0070126 | A1 | 3/2005 | Senzaki | WO | WO 99/01595 | 1/1999 |
| 2005/0095859 | A1 | 5/2005 | Chen et al. | WO | 99/29924 | 6/1999 |
| 2005/0104142 | A1 | 5/2005 | Narayanan et al. | WO | WO 99/65064 | 12/1999 |
| 2005/0110101 | A1* | 5/2005 | Kaneko et al. ............ 257/410 | WO | 00/16377 | 3/2000 |
| 2005/0153571 | A1 | 7/2005 | Senzaki | WO | WO 00/13235 | 3/2000 |
| 2005/0233156 | A1 | 10/2005 | Senzaki et al. | WO | 00/54320 | 9/2000 |
| 2005/0255243 | A1 | 11/2005 | Senzaki | WO | 00/70674 | 11/2000 |

FOREIGN PATENT DOCUMENTS

| | | | |
|---|---|---|---|
| EP | 0 497 267 | 8/1992 | |
| EP | 0 973 189 | 1/2000 | |
| EP | 0 973 191 | 1/2000 | |
| EP | 1 146 141 A2 | 10/2001 | |
| EP | 1 167 569 A1 | 1/2002 | |
| EP | 1 170 804 A2 | 1/2002 | |
| EP | 1321973 A2 | 6/2003 | |
| GB | 2 355 727 A | 5/2001 | |
| JP | 52-009228 | 1/1977 | |
| JP | 58-098917 | 6/1983 | |
| JP | 01-082671 | 3/1989 | |
| JP | 64-82671 | 3/1989 | |
| JP | 1-43221 | 6/1989 | |
| JP | 01-143221 | 6/1989 | |
| JP | 2-14513 | 1/1990 | |
| JP | 2-230690 | 9/1990 | |
| JP | 02-230690 | 9/1990 | |
| JP | 2-246161 | 10/1990 | |
| JP | 02-246161 | 10/1990 | |
| JP | 3-234025 | 10/1991 | |
| JP | 03-234025 | 10/1991 | |
| JP | 04-291916 | 10/1992 | |
| JP | 5-29228 | 2/1993 | |
| JP | 05-047666 | 2/1993 | |
| JP | 05-074724 | 3/1993 | |
| JP | 5-74724 | 3/1993 | |
| JP | 05-206036 | 8/1993 | |
| JP | 05-234899 | 9/1993 | |
| JP | 05-251339 | 9/1993 | |
| JP | 5-251339 | 9/1993 | |
| JP | 05-270997 | 10/1993 | |
| JP | 06-177381 | 6/1994 | |

| | | |
|---|---|---|
| WO | WO 00/79576 | 12/2000 |
| WO | 01/15220 | 3/2001 |
| WO | 01/17692 | 3/2001 |
| WO | 01/25502 | 4/2001 |
| WO | 01/27346 | 4/2001 |
| WO | 01/27347 | 4/2001 |
| WO | 01/29280 | 4/2001 |
| WO | 01/29891 | 4/2001 |
| WO | 01/29893 | 4/2001 |
| WO | WO 01/36702 | 5/2001 |
| WO | 01/40541 | 6/2001 |
| WO | 01/66832 | 9/2001 |
| WO | 01/82390 | 11/2001 |
| WO | WO 01/99166 A1 | 12/2001 |
| WO | 02/01628 | 1/2002 |
| WO | 02/09167 | 1/2002 |
| WO | WO 02/08488 | 1/2002 |
| WO | 02/27063 | 4/2002 |
| WO | 02/31875 | 4/2002 |
| WO | 02/43115 | 5/2002 |
| WO | 02/45167 | 6/2002 |
| WO | WO 02/45871 | 6/2002 |
| WO | 02/065525 | 8/2002 |
| WO | 02/067319 | 8/2002 |
| WO | WO 03/023835 | 3/2003 |

OTHER PUBLICATIONS

European Patent Office Communication dated Nov. 17, 2008 for EP Application No. 04759751.3.

Renaud Fix et al, "Chemical Vapor Deposition of Titanium, Zirconium, and Hafnium Nitride Thin Films." 6135 Chemistry of Materials, 3 Nov./Dec. 1991, No. 6, BNS pp. 1-11.

Ritala, et al., "Development of Crystallinity and Morphology in Hafnium Dioxide Thin Films Grown by Atomic Layer Epitaxy," Thin Solid Films, vol. 250, No. 1-2, (Oct. 1, 1994), p. 72-80.

Ritala, et al. "Perfectly Conformal TiN and $Al_2O_3$ Films Deposited by Atomic Layer Deposition," Chem. Vap. Deposition 1999, 5, No. 1.

Ritala, et al. "Atomic Layer Deposition of Oxide Thin Films with Metal Alkoxides as Oxygen Sources," Science vol. 288 Apr. 14, 2000.

Ritala, et al. Ann. Acad. Sci. Fenn. Ser. A II. Chemica 257 (1994) 1-48.

Paranjpe, et al. "Atomic Layer Deposition of $AlO_3$ for Thin Film Head Gap Applications," J. Elec. Soc., vol. 148, No. 9 Sep. 2001 pp. G465-471.

Ohshita, et al. "$HfO_2$ Growth by Low-pressure Chemical Vapor Deposition Using the $Hf(N(C_2H_5)_2)_4/O_2$ Gas System," Journal of Crystal Growth 233 (2001) 292-297.

Niinisto, et al. "Synthesis of Oxide Thin Films and Overlayers by Atomic Layer Epitaxy for Advanced Applications," Materials Science and Engineering B41 (1996) 23-29.

Min, et al. "Metal-organic Atomic-layer Deposition of Titanium-silicon-nitride Films," Applied Physics Letters, vol. 75, No. 11 (Sep. 11, 1999).

Min, et al. "Chemical Vapor Deposition of Ti-Si-N Films with Alternating Source Supply," Mat. Res. Soc. Symp. Proc. vol. 564 (1999).

Kukli, et al. "Tailoring the Dielectric Properties of $HfO_2$-$Ta_2O_5$ Nanolaminates," Applied Physics Letters, vol. 68, No. 26 (Jun. 24, 1996), pp. 3737-3739.

Kattelus, et al. "Electrical Properties of Tantalum Based Composite Oxide Films," Mat. Res. Soc. Symp. Proc., 284 (1993) 511-516.

Hwang, et al. "Nanometer-Size $\alpha$-$PbO_2$-type $TiO_2$ in Garnet: A Thermobarometer for Ultrahigh-Pressure Metamorphism," Science Vo. 288 (Apr. 14, 2000).

Hendrix, et al., "Composition Control of $Hf_{1-x}Si_xO_2$ Films Deposited on Si by Chemical-vapor Deposition Using Amide Precursors," Applied Physics Letters, vol. 80, No. 13 (Apr. 1, 2002).

George, et al., "Surface Chemistry for Atomic Layer Growth," J. Phys. Chem. 1996, 100, 13121-13131.

George, et al. "Atomic Layer Controlled Deposition of $SiO_2$ and $Al_2O_3$ using ABAB . . . binary reaction sequence chemistry," Applied Surface Science 82/83 (1994) 460-467.

Elers, et al. "$NbCl_5$ as a Precursor in Atomic Layer Epitaxy," Applied Surface Science 82/83 (1994) 468-474.

Derbyshire, "Applications of Integrated Processing," Solid State Technology, Dec. 1994.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Choi, et al. "The Effect of Annealing on Resistivity of Low Pressure Chemical Vapor Deposited Titanium Diboride," J. Appl. Phys. 69(11), Jun. 1, 1991.

Choi, et al. "Stability of $TiB_2$ as a Diffusion Barrier on Silicon," J. Electrochem. Soc., vol. 138, No. 10, Oct. 1991.

Cheon, et al. "Gas Phase Photoproduction of Diatomic Metal Nitrides During Metal Nitride Laser Chemical Vapor Deposition," Inorg. Chem. 1999, 38, 2238-2239.

Chang-Wook, et al. "Plasma-assisted Atomic Layer Growth of High-Quality Aluminum Oxide Thin Films," Jpn. J. Appl. Phys. 1, vol. 40, No. 1, Jan. 2001 pp. 285-289.

Chang-Wook, et al. "Growth and Characterization of Aluminum Oxide ($Al_2O_3$) Thin Films by Plasma-Assisted Atomic Layer Controlled Deposition," J. Korean Inst. Met. Mater., vol. 38, No. 10, Oct. 2000 pp. 1395-1399.

Bedair, "Atomic Layer Epitaxy Deposition Processes," J. Vac. Sci. Technol. B., vol. 12, No. 1, Jan./Feb. 1994.

Balog, et al. "Chemical Vapor Deposition and Characterization of $HfO_2$ Films from Organo-Hafnium Compounds," Thin Solid Films, 41 (1977) 247-259.

Argarwal, et al. "Challenges in Integrating the High-K Gate Dielectric Film to the Conventional CMOS Process Flow," Mat. Sec. Soc. Sump. Proc. vol. 670 (2001).

Kim, et al. "Substrate Dependence on the Optical Properties of $Al_2O_3$ Films Grown by Atomic Layer Deposition," Applied Phys. Lett. 71 (25), Dec. 22, 1997 (3604-6).

"A Novel Atomic Layer Deposition Process to Deposit Hafnium Silicate Thin Films", Senzaki, Yoshihide, et al., Electrochemical Society Proceedings vol. 2004-01, pp. 264-270, May 2004.

"Nitridation of Hafnium Silicate Thin Films", Chatham, Hood; et al., Mat. Res. Soc. Symp. Proc. vol. 811, Apr. 12-16, 2004, D7.5.1.

"Interval Annealing During Alternating Pulse Deposition", Conley, J.F.; et al., Mat. Res. Soc. Symp. Proc. vol. 811, Apr. 12-16, 2004, D1.3.1.

Ho, et al., "Suppressed crystallization of Hf-based gate dielectrics by controlled addition of $Al_2O_3$ using atomic layer deposition", Applied Physics Letters, American Institute of Physics, New York, US, vol. 81, No. 22, Nov. 25, 2002, pp. 4218-4220.

Kawahara, et al., "Effects of Hf sources, oxidizing agents, and $NH_3$ radicals on properties of $HfAlO_x$ films prepared by atomic layer deposition", IWGI 2003, Tokyo, Nov. 6, 2003, pp. 32-37.

Kukli, et al., "Atomic Layer Deposition of Hafnium Dioxide Films from Hafnium Tetrakis(ethylmethylamide) and Water", Chemical Vapor Deposition, VCH Publishers, Weinheim, DE, vol. 8, No. 5, Sep. 2002, pp. 199-204.

Ohshita, et al., "$Hf_{1-x}Si_xO_2$ deposition by metal organic chemical vapor deposition using the $Hf)NEt_2)_4/SiH(NEt_2)_3/O_2$ gas system", Preparation and Characterization, Elsevier Sequioa, NL, vol. 416, No. 1-2, Sep. 2, 2002, pp. 208-211.

Visokay, et al., "Application of HfSiON as a gate dielectric material", Applied Physics Letter, American Institute of Physics, New York, US, vol. 80, No. 17, Apr. 29, 2002, pp. 3183-3185.

International Search Report for International Application No. PCT/US2004/008961 dated Sep. 21, 2004.

Written Opinion of the International Searching Authority for International Application No. PCT/US2004/008961 dated Sep. 21, 2004.

Goto, et al. "Atomic layer controlled deposition of silicon nitride with self-limiting mechanism," Applied Physics Letters, American Institute of Physics. New York, US, vol. 68, No. 23, Jun. 3, 1996, pp. 3257-3259.

International Search Report for International Application No. PCT/US2005/016690 dated Aug. 22, 2005.

International Search Report for International Application No. PCT/US2005/016606 dated Aug. 22, 2005.

International Search Report for International Application No. PCT/US2005/016603 dated Sep. 15, 2005.

International Preliminary Report on Patentability for International Application No. PCT/US2004/008961 dated Oct. 27, 2005.

Kamiyama, et al. "Improvement in the uniformity and the thermal stability of Hf-silicate gate dielectric by plasma-nitridation," Gate Insulator, 2003. IWGI 2003, Extended Abstracts of International Workshop on Nov. 6-7, 2003, Piscataway, NJ, USA, IEEE, Nov. 6, 2002, pp. 42-46.

Lee, et al. "Cyclic Technique for the Enhancement of Highly Oriented Diamond Film Growth," Thin Solid Films 303 (1997) pp. 264-269.

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.

Written Opinion of the International Search Report for International Application No. PCT/US2005/016606 dated Aug. 22, 2005.

Written Opinion of the International Search Report for International Application No. PCT/US2005/016603 dated Sep. 15, 2005.

Written Opinion of the International Search Report for International Application No. PCT/US2005/016690 dated Aug. 22, 2005.

Written Opinion of the International Searching Authority for the International Preliminary Report on Patentability for International Application No. PCT/US2004/008961 dated Oct. 27, 2005.

European Search Report for Application No. 04759751.3 dated Mar. 16, 2006.

Notification of First Office Action dated May 23, 2008 for Chinese Patent Application No. 200480008427.0.

* cited by examiner

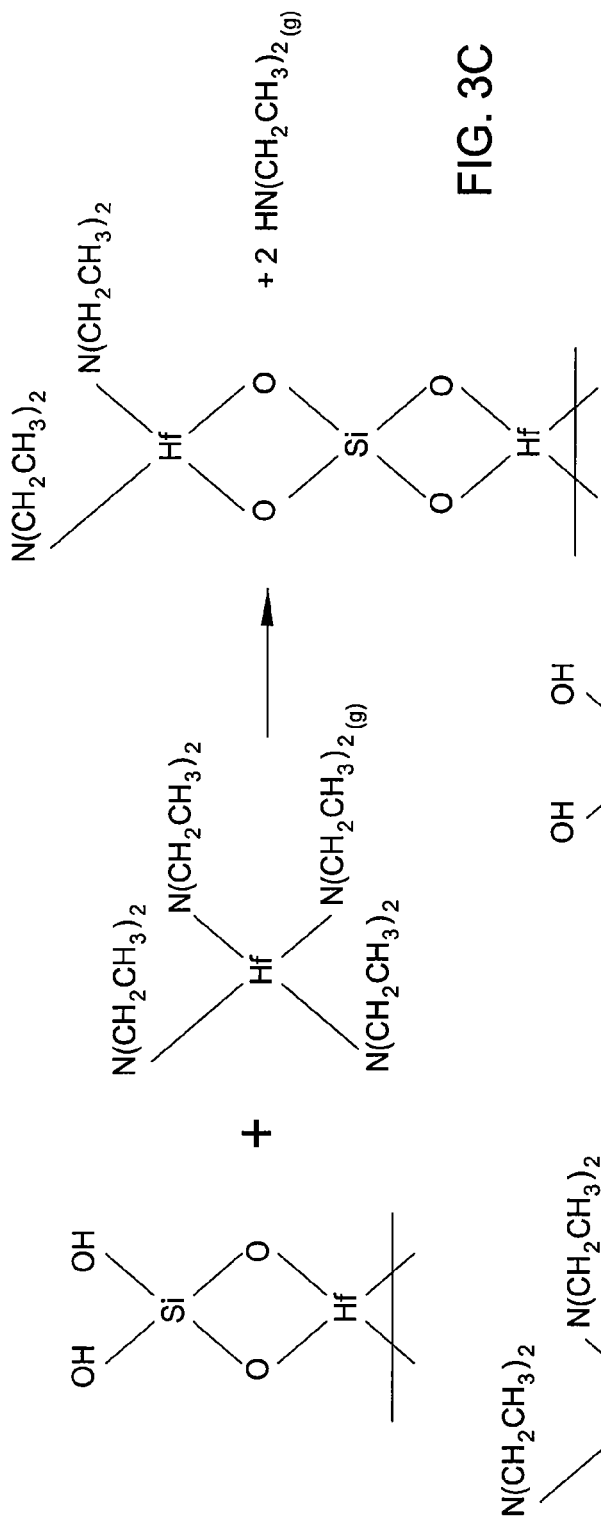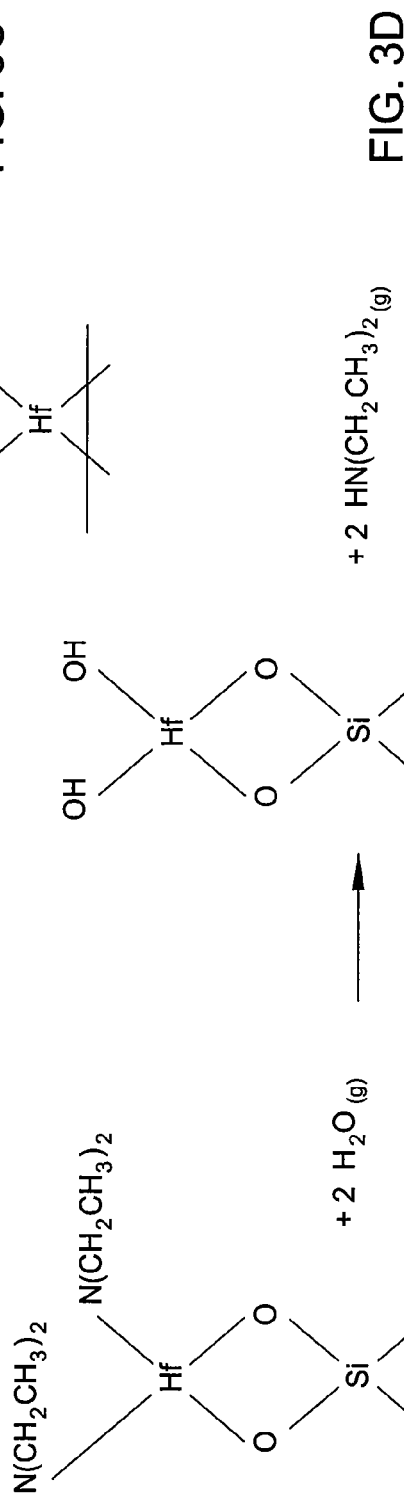
FIG. 3C
FIG. 3D

METHOD FOR HAFNIUM NITRIDE DEPOSITION

CROSS-REFERENCE TO RELATED APPLICATIONS

This application is a divisional application of co-pending U.S. patent application Ser. No. 10/407,930, filed Apr. 4, 2003, which is incorporated by reference herein.

BACKGROUND OF THE INVENTION

Field of the Invention

Embodiments of the present invention generally relate to methods to deposit materials on substrates, and more specifically, to methods for depositing metal oxides, metal nitrides, metal oxynitrides, metal silicates and metal silicon oxynitrides using atomic layer deposition processes.

In the field of semiconductor processing, flat-panel display processing or other electronic device processing, chemical vapor deposition has played an important role in forming films on substrates. As the geometries of electronic devices continue to shrink and the density of devices continues to increase, the size and aspect ratio of the features are becoming more aggressive, e.g., feature sizes of 0.07 microns and aspect ratios of 10 or greater are being considered. Accordingly, conformal deposition of materials to form these devices is becoming increasingly important.

While conventional chemical vapor deposition has proved successful for device geometries and aspect ratios down to 0.15 microns, the more aggressive device geometries require new, innovative deposition techniques. One technique that is receiving considerable attention is atomic layer deposition (ALD). In the scheme, reactants are sequentially introduced into a processing chamber where each reactant chemisorbs onto the surface of the substrate and a surface reaction occurs. A purge step is typically carried out between the delivery of each reactant gas. The purge step may be a continuous purge with the carrier gas or a pulse purge between the delivery of the reactant gases.

U.S. Pat. No. 6,287,965 describes a method of ALD to form a metal nitride layer having the structure of A-B-N, where A is a metal, B is an element to prevent crystallization and N is nitrogen. The preferred embodiment teaches a method to make TiAlN. No incorporation of oxygen into these films is disclosed; in fact, the invention teaches away from oxygen incorporation by sequentially stacking oxygen diffusion barrier layers between the metal nitride layers for oxygen protection.

U.S. Pat. No. 6,200,893, entitled "Radical-assisted Sequential CVD", describes a method for CVD deposition on a substrate wherein radical species such as hydrogen and oxygen or hydrogen and nitrogen are used in an alternative step with a molecular precursor to form one cycle. A composite integrated film is produced by repetitive cycles of the method. In a preferred embodiment, the deposited material from the molecular precursor are metals and the radicals, in the alternate steps, are used to remove ligands left from the metal precursor reactions. The radicals oxidize or nitridize the metal surface in subsequent layers in order to respectively yield metal oxide or nitride. In various embodiments of the reference, metallic hafnium and hafnium oxide are made from a halogen-containing precursor. However, the reference does not address complex hafnium compounds (tertiary, quaternary or pentanary) produced from metal organic compounds. Furthermore, the reference requires the use of radicals to incorporate oxygen and/or nitrogen into the film.

Therefore, there is a need for a process for depositing hafnium compounds such as nitrides, silicates, oxynitrides, silicon nitrides, silicon oxynitrides, aluminum oxynitrides and aluminum silicon oxynitrides from organometallic compounds.

SUMMARY OF THE INVENTION

In one embodiment, the present invention is a method for forming a layer comprising hafnium on a substrate surface, sequentially comprising: a) exposing the substrate surface to a hafnium precursor to form a hafnium containing layer on the substrate surface; b) purging the chamber with a purge gas; c) reacting a second precursor with the hafnium containing layer; d) purging the chamber with the purge gas; e) reacting a third precursor with the hafnium containing layer; f) purging the chamber with the purge gas; g) reacting a fourth precursor with the hafnium containing layer; and h) purging the chamber with the purge gas.

In another embodiment, the present invention is a method for growing a layer comprising hafnium, comprising exposing a substrate sequentially to at least four precursors during an ALD cycle to deposit a compound film comprising hafnium and at least three elements selected from the group consisting of silicon, aluminum, oxygen and nitrogen.

In another embodiment, the present invention is a method for depositing a hafnium compound on a substrate in a chamber during an atomic layer deposition process, comprising conducting a first half reaction comprising a hafnium precursor, conducting a second half reaction comprising an oxygen precursor, conducting a third half reaction comprising a nitrogen precursor and conducting a fourth half reaction comprising a silicon precursor.

In another embodiment, the present invention is a composition of a semiconductor material, comprising $HfSi_xO_yN_z$, wherein x is at least about 0.2 and less than about 4, y is at least about 0.5 and less than about 4 and z is at least about 0.05 and less than about 2.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

FIGS. 3A-3D are schemes to show an example of half reactions that are used to grow a hafnium silicate film.

DETAILED DESCRIPTION OF THE PREFERRED EMBODIMENT

Figure 1:
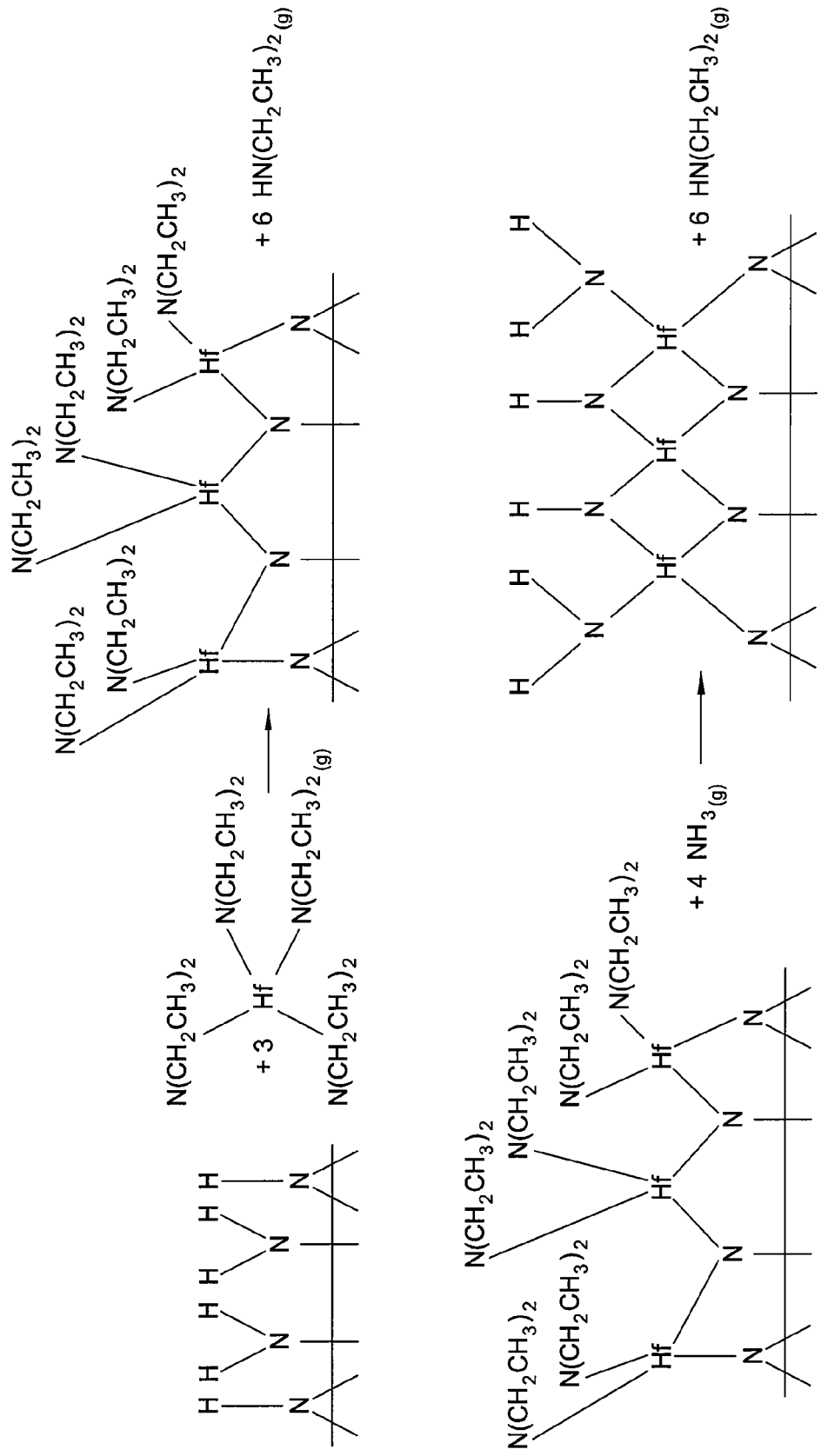
FIG. 1 is a scheme to show an example of half reactions that are used to grow a hafnium nitride film.

The present invention provides methods for preparing hafnium compounds used in a variety applications including high k dielectric materials. The methods use atomic layer deposition (ALD) to have elemental control of the composition of hafnium compounds. The elemental control is generally separated by half reactions.

Half reactions are abstractly demonstrated via the reaction:

$$AC+BD \rightarrow AB+CD,$$

wherein AB is the product compound and CD is the secondary compound or secondary product.

For example, a half reaction is demonstrated by each of the following steps:

$$*NH_2+(Et_2N)_4Hf \rightarrow *N=Hf(NEt_2)_2+2HNEt_2 \quad (1)$$

$$*N=Hf(NEt_2)_2+NH_3 \rightarrow *N=Hf=NH+2HNEt_2, \quad (2)$$

wherein the half reaction of step 1 is initiated by the functional group $NH_2$ and * is an atom or molecule that is part of the substrate, film or surface group. The hafnium precursor reacts with the $NH_2$ group and forms a Hf—N bond. Ligands are protonated from the hafnium precursor to form a secondary product. During the half reaction in step 2, ammonia reacts with the hafnium complex bound to the surface. The remaining ligands are protonated and removed while another Hf—N bond and another functional group (NH) are formed as the product compound. In each half reaction of steps 1 and 2, diethyl amine ($HNEt_2$) can be made as a secondary compound. Other secondary compounds are amines and hydrazines and include radicals, ions and variations to ligands, such as $Et_2N$, $(Et_2N)_2$, $EtNH$ and $(EtNH)_2$. Generally, these secondary compounds are readily removable, such as by vacuum and/or purge. The reaction schemes are not necessarily stoichiometric, but have a wide range of atomic ratios. Throughout the disclosure, reaction examples lack specific stoichiometry, bonding order and bonding connectivity of the product compounds and secondary compounds.

Another example of a half reaction is demonstrated by each of the following steps:

$$*OH+(Et_2N)_4Hf \rightarrow *O-Hf(NEt_2)_x+HNEt_2 \quad (3)$$

$$*O-Hf(NEt_2)_x+H_2O \rightarrow *O-Hf-(OH)+HNEt_2, \quad (4)$$

wherein the half reaction of step 3 is initiated by the functional OH group and forms a Hf—O bond. Step 4 proceeds to form another Hf—O bond as well as the terminus and functional OH group.

Therefore, in general, a first half reaction initiates with the reaction of a first functional group, establishes at least one product compound bond and establishes a second functional group. The second half reaction initiates with a reaction of the second functional group, establishes at least one product compound bond and establishes a third functional group. The third functional group, in many examples, is the same or similar to the first functional group. However, the second half reaction is still complete even when the third functional group is different. Examples with tertiary, quaternary and higher product compounds require half reactions with more than two precursors. Therefore, half reactions are not limited to only binary product compounds and may contain any number of half reactions. Most half reactions are sequentially separated by gas and/or vacuum purges.

Embodiments of the processes described herein deposit hafnium-containing materials on many substrates and surfaces. Substrates on which embodiments of the invention may be useful include, but are not limited to semiconductor wafers, such as crystalline silicon (e.g., Si<100> or Si<111>), silicon oxide, silicon germanium, doped or undoped polysilicon, doped or undoped silicon wafers silicon nitride and patterned or non-patterned wafers. Surfaces include bare silicon wafers, films, layers and materials with dielectric, conductive and barrier properties and include aluminum oxide and polysilicon. Pretreatment of surfaces includes polishing, etching, reduction, oxidation, hydroxylation, annealing and baking.

A substrate can be pretreated to be terminated with a variety of functional groups such as hydroxyls (OH), alkoxy (OR, where R=Me, Et, Pr or Bu), haloxyls (OX, where X=F, Cl, Br or I ), halides (F, Cl, Br or I ), oxygen radicals, aminos (NH or $NH_2$) and amidos (NR or $NR_2$, where R=Me, Et, Pr or Bu). A pretreatment can be accomplished by administering a reagent, such as $NH_3$, $B_2H_6$, $SiH_4$, $SiH_6$, $H_2O$, HF, HCl, $O_2$, $O_3$, $H_2O_2$, $H_2$, atomic-H, atomic-N, atomic-O, alcohols or amines.

Once the surface of the substrate is pretreated, an ALD cycle is started. For many of the hafnium compounds, the hafnium precursor adsorption is self-limiting under certain process conditions, and generally must be at low temperatures (<500° C.) to exhibit this behavior. Some examples of half reactions that are self-limiting for the hafnium precursor include:

$$*NH_2+(Et_2N)_4Hf \rightarrow *N=Hf(NEt_2)_2+2HNEt_2$$

$$*NH+(Et_2N)_4Hf \rightarrow *N-Hf(NEt_2)_3+HNEt_2$$

$$*OH+(Et_2N)_4Hf \rightarrow *O-Hf(NEt_2)_3+HNEt_2$$

wherein, hafnium is added to produce either $*O-Hf(NEt_2)_x$ or $*N-Hf(NEt_2)_x$. An atom, such as a nitrogen or oxygen, can anchor the hafnium atom to the substrate or surface. $*Hf(NEt_2)_x$ is self-limiting because the hafnium precursor will not react further; therefore, this is the first half reaction. To proceed with other half reactions, either an oxygen source (e.g., water) or a nitrogen source (e.g., ammonia) is added.

The first half reaction with a hafnium precursor initiates a series of many half reactions to make binary, tertiary, quaternary and more complex compounds. The first half reaction does not have to include a hafnium precursor, but can include any precursor to which a particular element is incorporated into the film. The following examples will portray hafnium precursors as the first half reaction in order to more clearly explain aspects of the invention.

One embodiment of the invention is directed to a process which proceeds with the half reaction of $NH_3$ to $*Hf(NEt_2)_x$ to produce *Hf—NH. Hafnium nitride is synthesized by sequentially proceeding with a half reaction of the hafnium precursor and a half reaction of a nitrogen source. FIG. 1 depicts a half reaction which is initiated by dosing $(Et_2N)_4Hf$ from about 0.01 second to about 10 seconds, preferably about 0.25 second and dosing an inert gas purge from about 0.01 second to about 20 seconds, preferably about 0.25 second. A second half reaction is then initiated by dosing $NH_3$ from about 0.01 second to about 10 seconds, preferably about 0.25 second and dosing an inert gas purge from about 0.01 second to about 20 seconds, preferably about 0.25 second. The two half reactions are cycled several times to grow a hafnium nitride film at the rate of about 50 ng/cm² per cycle. By varying the cycle time, temperature, pressure and/or concentration, stoichiometry of the product compound is controlled. Slight variations of the stoichiometry can have an impact on the electrical properties, e.g., $Hf_3N_4$ is an insulating material while HfN is a conducting material. In one embodiment, HfN is made from a nitrate-free hafnium precursor. Hafnium nitride films can have oxygen contamination, since nitrates contain an oxygen/nitrogen ratio of three.

In one embodiment, a method for forming a semiconductor material by atomic layer deposition includes pulsing a hafnium precursor and a nitrogen precursor sequentially and cyclically. The hafnium nitride is deposited to the substrate surface wherein the hafnium nitride has a formula $HfN_x$ and x is at least about 1.1 and less than about 1.3. In one aspect, the hafnium precursor is TDEAH and the nitrogen precursor is $NH_3$. In another aspect, the hafnium precursor is HfCl4 and the nitrogen precursor is a radical nitrogen, such as atomic nitrogen.

Figure 2:
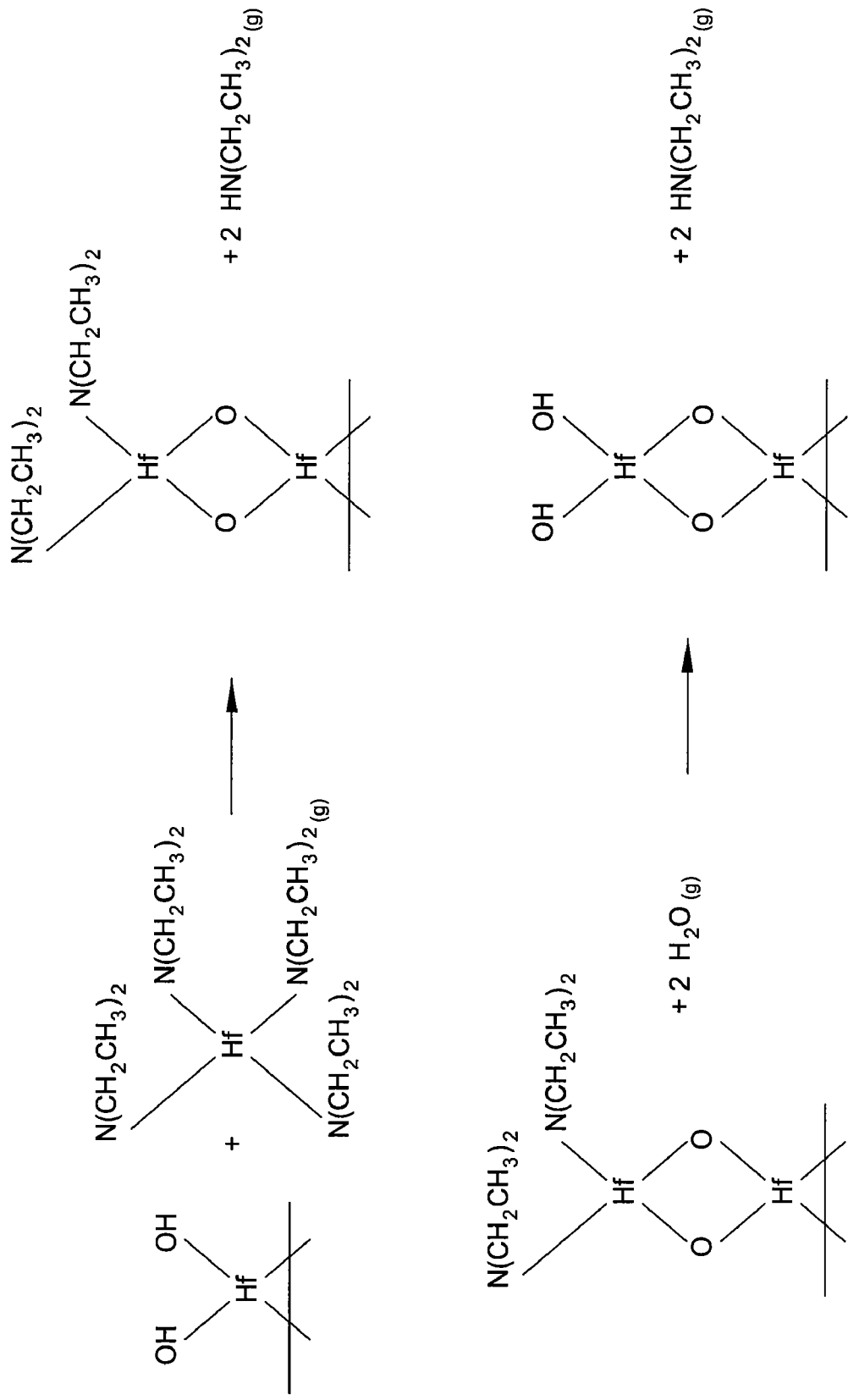
FIG. 2 is a scheme to show an example of half reactions that are used to grow a hafnium oxide film.
Figure 3A:
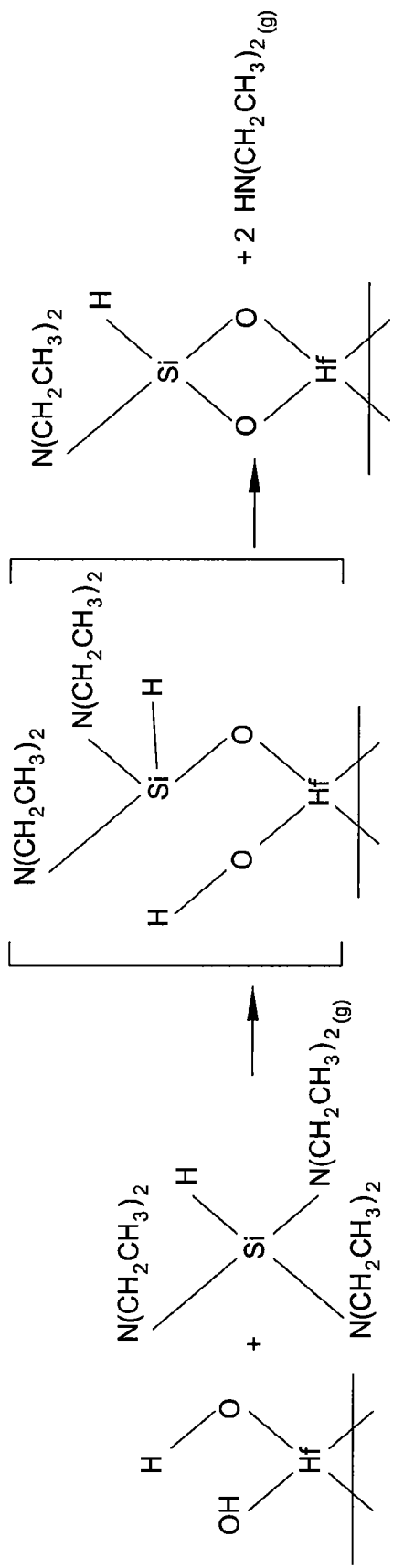
Figure 3B:
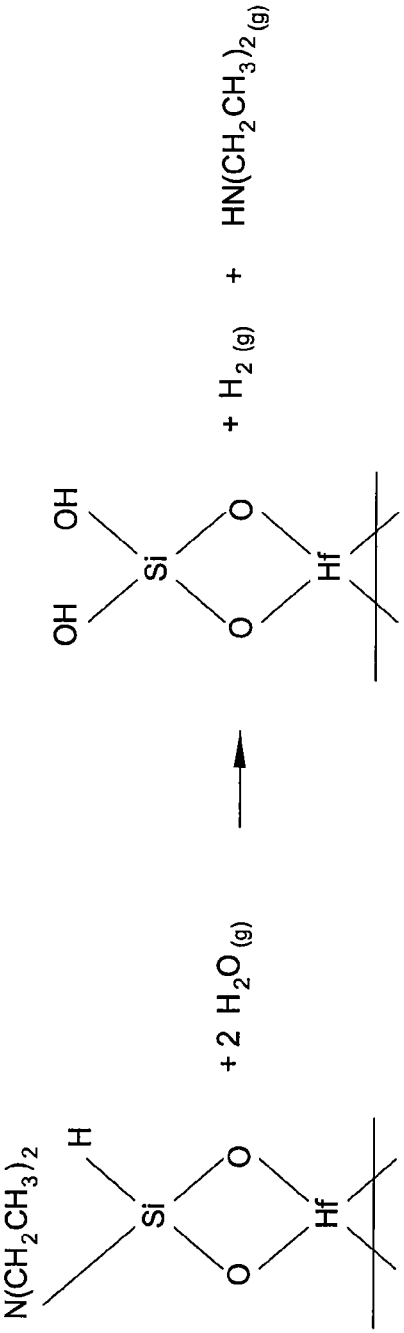
Figure 4A:
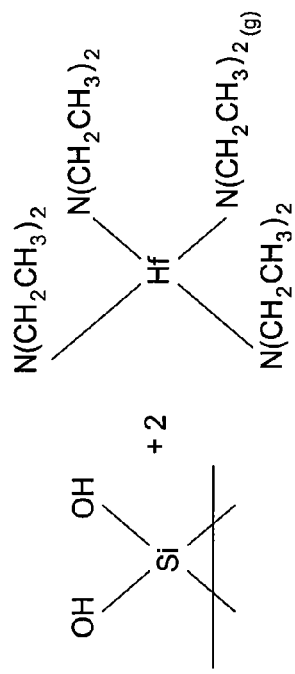
FIGS. 4A-4D are schemes to show an example of half reactions that are used to grow a hafnium silicon oxynitride film.
Figure 4A:
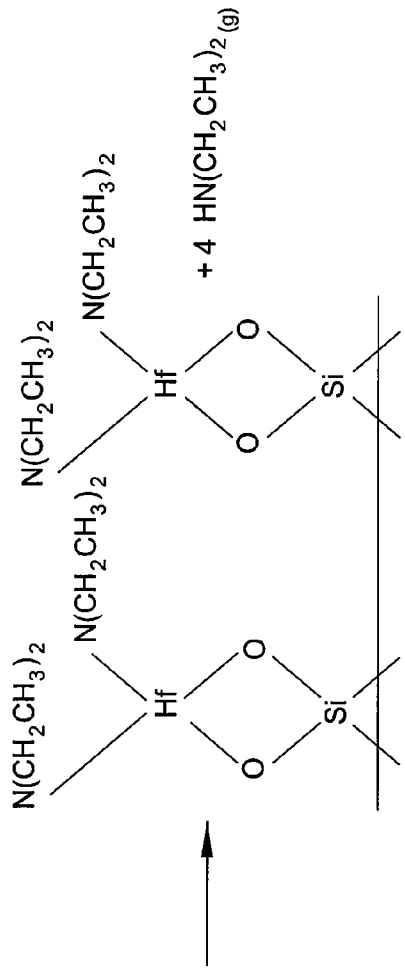
Figure 4B:
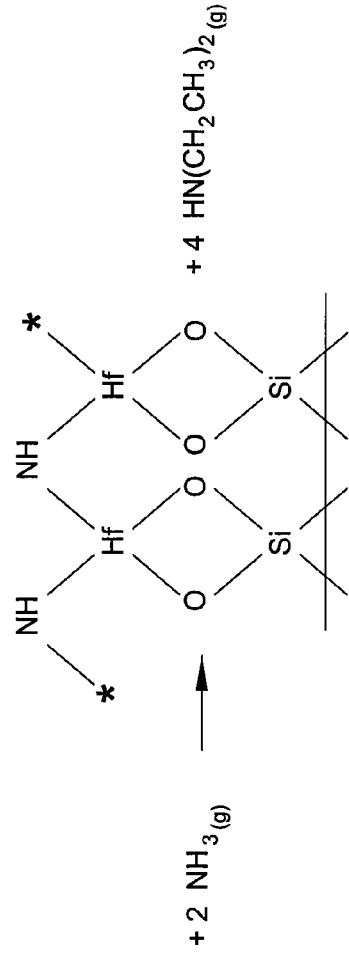
Figure 4C:
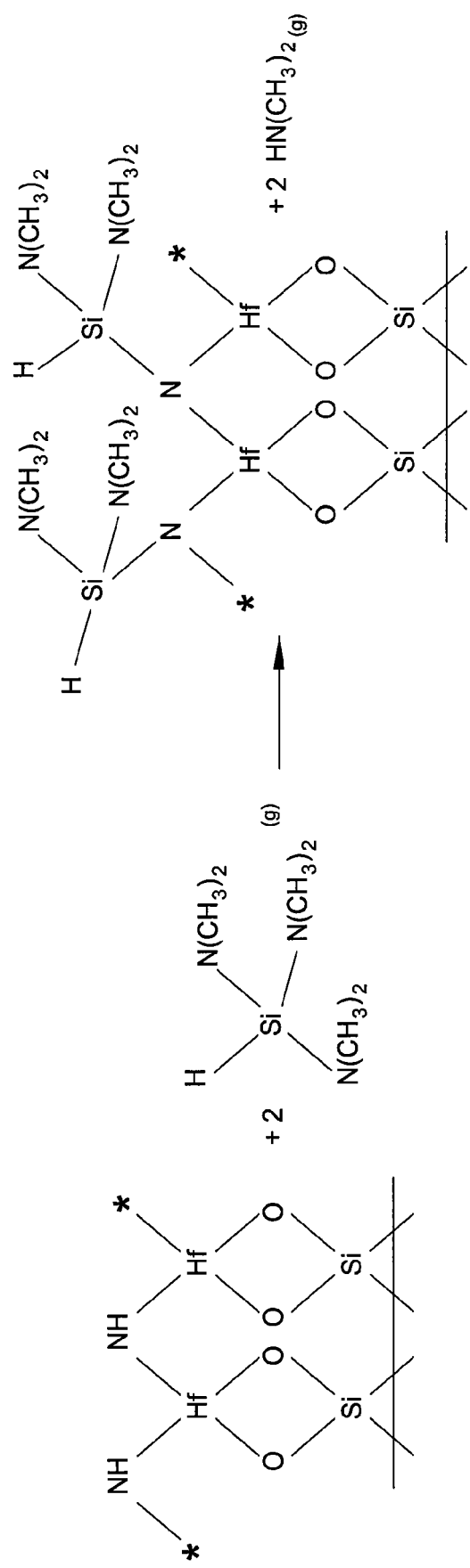
Figure 4D:
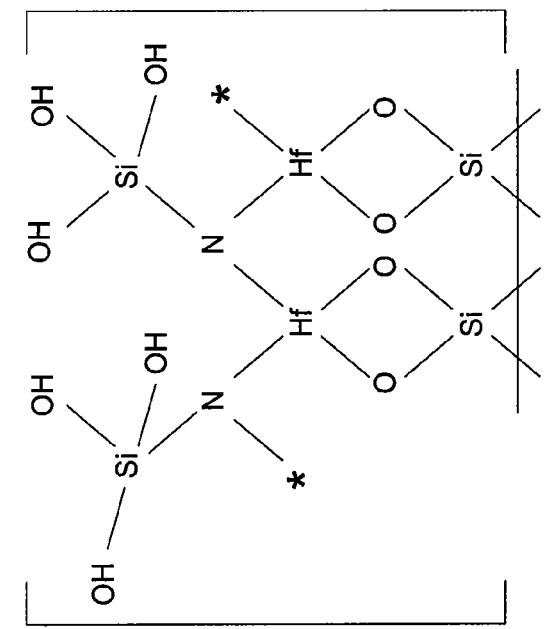
Figure 4D:
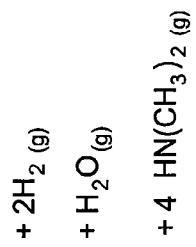
Figure 4D:
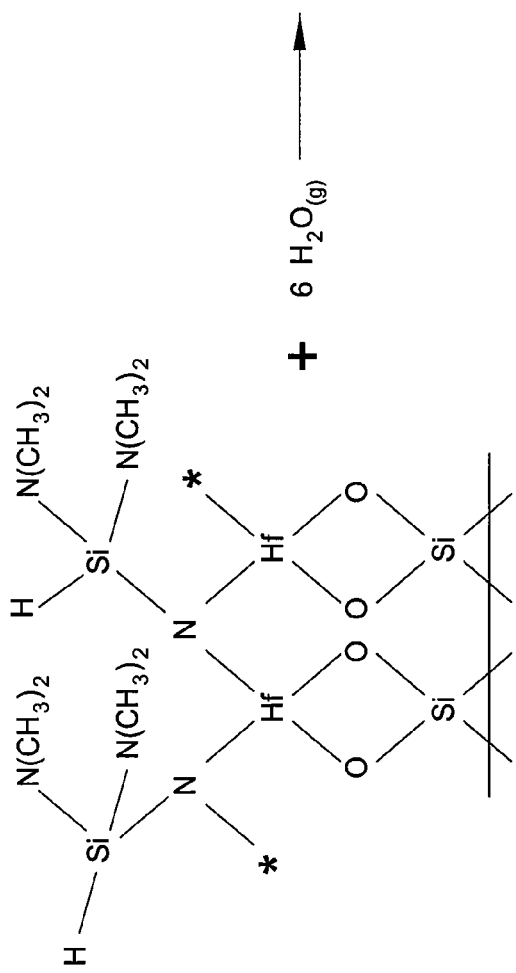
Figure 4D:
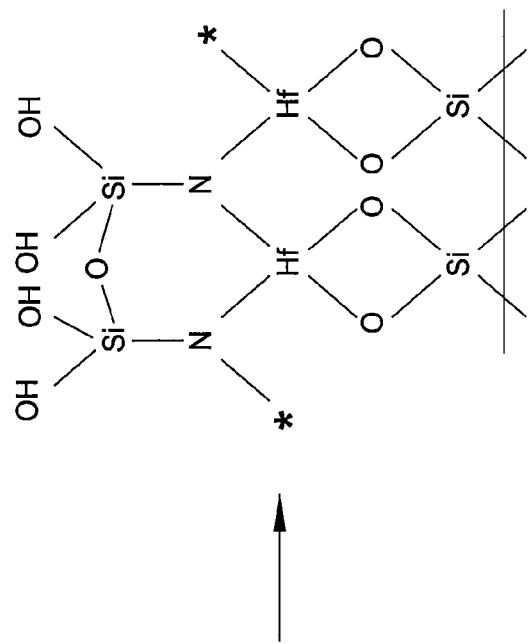

Another embodiment of the invention is directed to a process which proceeds with the half reaction of $H_2O$ to *Hf $(NEt_2)_x$ and produce *Hf—OH. Hafnium oxide is synthesized by sequentially proceeding with a half reaction of the hafnium precursor and a half reaction of an oxygen source. FIG. 2 depicts a half reaction which is initiated by dosing $(Et_2N)_4Hf$ from about 0.01 second to about 10 seconds and an inert gas purge dosed for about 0.01 second to about 20 seconds. A second half reaction is then initiated by dosing $H_2O$ from about 0.01 second to about 10 seconds and an inert gas purge from about 0.01 second to about 20 seconds. The two half reaction are cycled several times to grow a hafnium oxide film at the rate of about 1.2 Å per cycle.

The processes to grow the hafnium nitride or hafnium oxide films, as described above, can be modified to achieve other materials, namely tertiary compounds. Hafnium nitride is porous and reacts with water to form hafnium oxynitride, Hf—O—N. Therefore, to the hafnium nitride cycle, a half reaction of an oxygen source (e.g., water) is added to synthesize hafnium oxynitride. The ratio of Hf:O:N is controlled and varied to the desired characteristics of the product compound. In one embodiment, an oxygen precursor half reaction is included into the half reaction cycle. Such a cycle comprises a hafnium precursor half reaction, a nitrogen precursor half reaction, another hafnium precursor half reaction and an oxygen precursor half reaction. The oxygen precursor half reaction can be added into the cycle at any ratio relative to the hafnium and nitrogen precursor half reactions. As an example, an oxygen precursor half reaction is added at every ten complete cycles of hafnium and nitrogen precursor half reactions. Furthermore, the ratio can be varied in order to control the oxygen stoichiometry by film depth. Hence, a graded film is formed. In one embodiment, the process conditions are as follows, pressure is about 1 Torr, temperature is about 225° C., argon carrier flow is about 200 sccm, $H_2O$ and $NH_3$ are dosed into the argon carrier flow in the range from about 1 second to about 4 seconds and TDEAH is dosed at about 20 seconds.

Graded films can be used to transition between various materials. One embodiment uses the method to transition between hafnium nitride and hafnium oxide. Within the hafnium nitride film, the elemental ratios N:Hf:O start out at 10:10:0, progress to 10:10:1, progress to 5:10:5, progress to 1:10:10 and finally 0:10:10, such that the film at the exposed surface following deposition is hafnium oxide. Graded films have advantageous characteristics, such as allowing control of electrical properties throughout the depth of the film, as well as higher levels of film adhesion.

Additional embodiments include methods to synthesize hafnium oxynitride. Due to the porosity of hafnium nitride, multiple layers are susceptible to oxygen enrichment. Instead of incorporating oxygen into each surface layer via half reactions, an excess oxygen precursor (e.g., water) is used to penetrate multiple layers of hafnium nitride and form a hafnium oxynitride graded film such as:

HfN—HfN—HfN—HfN—HfN+xs $H_2O$ →HfN—HfN—HfON—HfON—HfON.

Therefore, hafnium nitride can be formed by ALD, CVD, PVD or other techniques and thereafter oxygenated with an oxygen precursor.

Other embodiments of the invention include methods to synthesize tertiary hafnium nitride compounds incorporating silicon. Preferred silicon precursor compounds include $(Me_2N)_4Si$ and $(Me_2N)_3SiH$. In one embodiment, a silicon precursor half reaction is included into the half reaction cycle for hafnium nitride formation. The cycle includes a hafnium precursor half reaction, a nitrogen precursor half reaction, a silicon precursor half reaction and another nitrogen precursor half reaction. The silicon precursor half reaction is added into the cycle at any ratio relative to the hafnium and nitrogen precursor half reactions. As an example, a silicon precursor half reaction is added about at every two complete cycles of hafnium and nitrogen precursor half reactions. Furthermore, the ratio can be varied in order to control the ratio of the silicon incorporated by depth of the film. Similarly to hafnium oxynitride, the method enables control of the Hf:Si:N stoichiometry.

Other embodiments of the invention are methods to synthesize tertiary hafnium oxide compounds incorporating nitrogen. Similarly as discussed above, the method reverses to use of oxygen and nitrogen to synthesize hafnium oxynitride. In one embodiment, a nitrogen precursor half reaction is included into the half reaction cycle of hafnium oxide. The cycle comprises a hafnium precursor half reaction, an oxygen precursor half reaction, another hafnium precursor half reaction and a nitrogen precursor half reaction. The nitrogen precursor half reaction is added into the cycle at any ratio relative to the hafnium and oxygen precursor half reactions. As an example, a nitrogen precursor half reaction is added at every two complete cycles of hafnium and oxygen precursor half reactions. Furthermore, the ratio can be varied in order to control the ratio of the nitrogen incorporated by depth of the growing film.

Other embodiments of the invention include methods to synthesize tertiary hafnium oxide compounds incorporating silicon, namely hafnium silicate (Hf—Si—O), as depicted in FIGS. 3A-3D. In one embodiment, a silicon source half reaction is included into the half reaction cycle of hafnium oxide. The cycle comprises a silicon precursor half reaction, an oxygen precursor half reaction, a hafnium precursor half reaction and another oxygen precursor half reaction. Purges occur between each half reaction. The silicon precursor half reaction can be added into the cycle at any ratio relative to the hafnium and oxygen precursor half reactions. As an example, a silicon precursor half reaction is added at every two complete cycles of hafnium and oxygen precursor half reactions. Furthermore, the ratio can be varied in order to control the ratio of the silicon incorporated by depth of the film.

Embodiments of the invention include multiple methods to synthesize quaternary compounds, especially hafnium silicon oxynitride (HfSiON), as depicted in FIGS. 4A-4D. Methods to synthesize two tertiary compounds (HfSiO and HfSiN) are modified to respectively nitridized or oxidized within the cycles to form the quaternary complex HfSiON. Half reactions of nitrogen, oxygen or silicon precursors are added at particular cycles, providing complete control to the N:O:Si ratios relative to hafnium.

In one embodiment, a nitrogen source half reaction is included into the half reaction cycle of hafnium silicate. Such a cycle comprises a silicon precursor half reaction, an oxygen precursor half reaction, a hafnium precursor half reaction and a nitrogen precursor half reaction. The nitrogen precursor half reaction can be added into the cycle at any ratio relative to the hafnium, silicon and oxygen precursor half reactions. As an example, a nitrogen precursor half reaction can be added at about every two complete cycles of hafnium, silicon and oxygen precursor half reactions. Furthermore, the cycle ratio can be varied in order to control the nitrogen ratio incorporated within film depth. Some embodiments grow hafnium silicon oxynitride graded films with higher concentrations of nitrogen near the top of the film.

In one aspect, the surface is terminated with a *SiOH group. The half reaction cycles are conducted with a hafnium precursor, a nitrogen precursor, a silicon precursor and an oxygen precursor, each separated with a purge. The respective precursors can be TDEAH, ammonia, Tris-DMAS and water. In another aspect, the respective precursors are $HfCl_4$, radical nitrogen, $Si_2Cl_6$ and $O_3$. The composition is controlled to form a semiconductor material, comprising $HfSi_x$-$O_yN_z$, wherein x is at least about 0.2 and less than about 4, y is at least about 0.5 and less than about 4 and z is at least about 0.05 and less than about 2.

Embodiments of the invention include multiple methods to synthesize pentanary compounds, especially hafnium aluminum silicon oxynitride (HfAlSiON). Half reactions of hafnium, aluminum, nitrogen, oxygen and silicon precursors are added at particular cycles, providing complete control to the Al:N:O:Si ratios relative to hafnium. In one aspect of the process, one cycle of half reaction pulses will include, in the respective order, water, TDEAH, ammonia, Tris-DMAS, water and TMA. In another aspect of the process, one cycle of half reaction pulses will include, in the respective order, water, $HfCl_4$, ammonia, Tris-DMAS, water and TMA.

Therefore, any stoichiometry of the following compounds is made by methods of the process: HfO, HfN, HfON, HfSiO, HfSiN, HfSiON, HfAlO, HfAlN, HfAlON, HfSiAlO, HfSiAlN, HfSiAlON. Therefore, ALD provides stoichiometric control during the deposition of product compounds. The stoichiometry may be altered by various procedures following the deposition process, such as when $Hf_3N_4$ is thermally annealed to form HfN. Stoichiometry is also controlled by altering the precursor ratios during deposition.

Many industrial applications exist for the product compounds synthesized by the various embodiments of the invention. Within the microelectronics industry, the product compounds are used as high-k transistor gate dielectric materials, transistor gate interface engineering, high-k capacitor dielectric materials (DRAMs), seed layers, diffusion barrier layers, adhesion layers, insulator layers, conducting layers and functionalized surface groups for patterned surfaces (e.g., selective deposition). In the realm of microelectromechanical systems (MEMS), the materials formed by the claimed invention are used as insulating, conducting or structural films. The materials can also serve as functionalized surface groups to reduce stiction. Additional functionality of surface groups is used in gas or liquid chromatography, chemical sensors and active sites for chemical attachment, patterned surfaces (e.g., combinatorial chemistry). Silicon nitride is also used as a hardening coating on tools and within optical devices.

Many precursors are within the scope of the invention. One important precursor characteristic is to have a favorable vapor pressure. Precursors may be a plasma, gas, liquid or solid at ambient temperature and pressure. However, within the ALD chamber, precursors are volatilized. Organometallic compounds or complexes include any chemical containing a metal and at least one organic group, such as alkyls, alkoxyls, alkylamidos and anilides. Precursors comprise of organometallic and halide compounds.

Exemplary hafnium precursors include hafnium compounds containing ligands such as alkylamidos, cyclopentadienyls, halides, alkyls, alkoxides and combinations thereof. Alkylamido hafnium compounds used as hafnium precursors include $(RR'N)_4Hf$, where R or R' are independently hydrogen, methyl, ethyl, propyl or butyl. Specific hafnium precursors include: $(Et_2N)_4Hf$, $(Me_2N)_4Hf$, $(EtMeN)_4Hf$, $(^tBuC_5H_4)_2HfCl_2$, $(C_5H_5)_2HfCl_2$, $(EtC_5H_4)_2HfCl_2$, $(Me_5C_5)_2HfCl_2$, $(Me_5C_5)HfCl_3$, $(^iPrC_5H_4)_2HfCl_2$, $(^iPrC_5H_4)HfCl_3$, $(^tBuC_5H_4)_2HfMe_2$, $(acac)_4Hf$, $(hfac)_4Hf$, $(tfac)_4Hf$, $(thd)_4Hf$, $Br_4Hf$, $Cl_4Hf$, $I_4Hf$, $(NO_3)_4Hf$, $(^tBuO)_4Hf$, $(^iPrO)_4Hf$, $(EtO)_4Hf$ and $(MeO)_4Hf$.

Exemplary silicon precursors include: alkylamidosilanes (e.g, $(Me_2N)_4Si$, $(Me_2N)_3SiH$, $(Me_2N)_2SiH_2$, $(Me_2N)SiH_3$, $(Et_2N)_4Si$, $(Et_2N)_3SiH$), $Si(NCO)_4$, $MeSi(NCO)_3$, $SiH_4$, $Si_2H_6$, $SiCl_4$, $Si_2Cl_6$, $MeSiCl_3$, $HSiCl_3$, $Me_2SiCl_2$, $H_2SiCl_2$, silanols (e.g., $MeSi(OH)_3$, $Me_2Si(OH)_2$), $(EtO)_4Si$ and various alkoxy silanes (e.g., $(RO)_{4-n}SiL_n$, where R=methyl, ethyl, propyl and butyl and L=H, OH, F, Cl, Br or I and mixtures thereof). Also, higher silanes are used as silicon precursors by processes of the invention. Higher silanes are disclosed in U.S. provisional patent applications, 60/419,426, 60/419,376 and 60/419,504, each filed on Oct. 18, 2002, assigned to Applied Material, Inc., and each entitled, "Low temperature deposition with silicon compounds" and are incorporated herein by reference in entirety for the purpose of describing silicon precursors.

Exemplary nitrogen precursors include: $NH_3$, $N_2$, hydrazines (e.g., $N_2H_4$ or $MeN_2H_3$), amines (e.g., $Me_3N$, $Me_2NH$ or $MeNH_2$), anilines (e.g., $C_6H_5NH_2$), organic azides (e.g., $MeN_3$ or $Me_3SiN_3$), inorganic azides (e.g., $NaN_3$ or $CP_2CoN_3$) and radical nitrogen compounds (e.g., $N_3$, $N_2$, N, NH or $NH_2$). Radical nitrogen compounds can be produced by heat, hot-wires and/or plasma.

Exemplary oxygen precursors include: $H_2O$, $H_2O_2$, $O_3$, $O_2$, NO, $N_2O$, $NO_2$, $N_2O_5$, alcohols (e.g., ROH, where R=Me, Et, Pr and Bu), peroxides (organic and inorganic) carboxylic acids and radical oxygen compounds (e.g., O, $O_2$, $O_3$ and OH radicals). Radical oxygen compounds can be produced by heat, hot-wires and/or plasma.

Exemplary aluminum precursors include: aluminum alkyls such as: $Me_3Al$, $Et_3Al$, $Pr_3Al$, $Bu_3Al$, $Me_2AlH$, $Et_2AlH$, $Me_2AlCl$, $Et_2AlCl$, aluminum alkoxyls such as: $(MeO)_3Al$, $(EtO)_3Al$, $(PrO)_3Al$ and $(BuO)_3Al$, aluminum dimmers, aluminum halides and aluminum hydrides.

The processes of the invention can be carried out in equipment known in the art of ALD. The apparatus brings the sources into contact with a heated substrate on which the films are grown. Hardware that can be used to deposit films is an ALD apparatus as disclosed in U.S. patent application Ser. No. 10/251,715, filed Sep. 20, 2002, assigned to Applied Material, Inc., Santa Clara, Calif. and entitled "An Apparatus for the Deposition of High Dielectric Constant Films", and is incorporated herein by reference in entirety for the purpose of describing the apparatus. Carrier gases or purge gases include $N_2$, Ar, He, $H_2$, forming gas and mixtures thereof.

In one embodiment, hydrogen gas is applied as a carrier gas, purge and/or a reactant gas to reduce halogen contamination from the film. Precursors that contain halogen atoms (e.g., $HfCl_4$, $SiCl_4$ and $Si_2Cl_6$) readily contaminate the film. Hydrogen is a reductant and will produce hydrogen chloride as a volatile and removable by-product. Therefore, hydrogen is used as a carrier gas or reactant gas when combined with a precursor compound (i.e., hafnium, silicon, aluminum, oxygen or nitrogen precursors) and can include another carrier gas (e.g., Ar or $N_2$). In one aspect, a water/hydrogen mixture, at a temperature in the range from about 250° C. to about 650° C., is used to reduce the halogen concentration and increase the oxygen concentration of the film.

The present invention provides methods for preparing the following compounds. The subscripts (w, x, y, z) imply that stoichiometry is intentionally varied (i.e., compositionally controlled) via ALD dosing sequences to form the following product compounds:

| | |
|---|---|
| hafnium aluminate: | $HfAl_xO_y$ |
| hafnium oxide: | $HfO_2$ and $HfO_x$ |
| hafnium nitride: | $Hf_3N_4$, $HfN$ and $HfN_x$ |
| hafnium oxynitride: | $HfO_xN_y$ |
| hafnium aluminum oxynitride: | $HfAl_xO_yN_z$ |
| hafnium silicate: | $HfSiO_4$, $Hf_4SiO_{10}$, $Hf_3SiO_8$, $Hf_2SiO_6$, $HfSiO_2$, $Hf_xSi_yO_{2(x+y)}$ and $Hf_xSi_yO$ |
| aluminum silicate: | $Al_6Si_2O_{13}$ and $Al_xSi_yO$ |
| hafnium aluminum silicate: | $Hf_2Al_6Si_4O_{21}$ and $Hf_xAl_ySi_zO$ |
| hafnium silicon nitride: | $Hf_xSi_yN$ |
| hafnium silicon oxynitride: | $Hf_2Si_2N_2O_5$ and $HfSi_xO_yN_z$ |
| aluminum silicon oxynitride: | $AlSi_xO_yN_z$ |
| hafnium aluminum silicon oxynitride: | $HfAl_wSi_xO_yN_z$ |

The list of product compounds is only partial and other materials are prepared with the methods of the invention. Other elements, such as carbon, titanium, tungsten, ruthenium, tantalum, zirconium, molybdenum, iridium, nickel, copper, tin, boron or phosphorus may be incorporated into the films as product compounds. Therefore, a product compound may comprise hafnium silicon oxynitride and carbon. Examples of half reactions are listed below. Note, that *=surface species.

Reactivity of Precursors with Surface Hydroxyl Groups (—OH)

$$Al{-}OH^* + TDMAS_{(g)} \rightarrow Al{-}O{-}Si(N(CH_3)_2)^* + xs\ HN(CH_3)_{2(g)}$$

$$Al{-}OH^* + TrisDMAS_{(g)} \rightarrow Al{-}O{-}SiH(N(CH_3)_2)^* + xs\ HN(CH_3)_{2(g)}$$

$$Al{-}OH^* + TrisDMAS_{(g)} \rightarrow Al{-}O{-}Si(N(CH_3)_2)^* + xs\ HN(CH_3)_{2(g)} + H_{2(g)}$$

$$Al{-}OH^* + TDEAH_{(g)} \rightarrow Al{-}O{-}Hf(N(CH_2CH_3)_2)^* + xs\ HN(CH_2CH_3)_{2(g)}$$

$$Al{-}OH^* + TMA_{(g)} \rightarrow Al{-}O{-}AlCH_3^* + xs\ CH_{4(g)}$$

$$Hf{-}OH^* + TDMAS_{(g)} \rightarrow Hf{-}O{-}Si(N(CH_3)_2)^* + xs\ HN(CH_3)_{2(g)}$$

$$Hf{-}OH^* + TrisDMAS_{(g)} \rightarrow Hf{-}O{-}SiH(N(CH_3)_2)^* + xs\ HN(CH_3)_{2(g)}$$

$$Hf{-}OH^* + TrisDMAS_{(g)} \rightarrow Hf{-}O{-}Si(N(CH_3)_2)^* + xs\ HN(CH_3)_{2(g)} + H_{2(g)}$$

$$Hf{-}OH^* + TDEAH_{(g)} \rightarrow Hf{-}O{-}Hf(N(CH_2CH_3)_2)^* + xs\ HN(CH_2CH_3)_{2(g)}$$

$$Hf{-}OH^* + TMA_{(g)} \rightarrow OH{-}AlCH_3^* + xs\ CH_{4(g)}$$

$$Si{-}OH^* + TDMAS_{(g)} \rightarrow Si{-}O{-}Si(N(CH_3)_2)^* + xs\ HN(CH_3)_{2(g)}$$

$$Si{-}OH^* + TrisDMAS_{(g)} \rightarrow Si{-}O{-}SiH(N(CH_3)_2)^* + xs\ HN(CH_3)_{2(g)}$$

$$Si{-}OH^* + TrisDMAS_{(g)} \rightarrow Si{-}O{-}Si(N(CH_3)_2)^* + xs\ HN(CH_3)_{2(g)} + H_{2(g)}$$

$$Si{-}OH^* + TDEAH_{(g)} \rightarrow Si{-}O{-}Hf(N(CH_2CH_3)_2)^* + xs\ HN(CH_2CH_3)_{2(g)}$$

$$Si{-}OH^* + TMA_{(g)} \rightarrow Si{-}O{-}AlCH_3^* + xs\ CH_{4(g)}$$

Reactivity of Surface Products with $H_2O_{(g)}$ to Regenerate Surface Hydroxyl (—OH) Groups.

$$Al{-}O{-}Si(N(CH_3)_2)^* + H_2O \rightarrow Al{-}O{-}Si(OH)^* + xs\ HN(CH_3)_{2(g)}$$

$$Al{-}O{-}SiH(N(CH_3)_2)^* + H_2O \rightarrow Al{-}O{-}SiH(OH)^* + xs\ HN(CH_3)_{2(g)}$$

$$Al{-}O{-}SiH(N(CH_3)_2)^* + H_2O \rightarrow Al{-}O{-}Si(OH)^* + xs\ HN(CH_3)_{2(g)} + H_{2(g)}$$

$$Al{-}O{-}Si(N(CH_3)_2)^* + H_2O \rightarrow Al{-}O{-}Si(OH)^* + xs\ HN(CH_3)_{2(g)}$$

$$Al{-}O{-}Hf(N(CH_2CH_3)_2)^* + H_2O \rightarrow Al{-}O{-}Hf(OH)^* + xs\ HN(CH_2CH_3)_{2(g)}$$

$$Al{-}O{-}AlCH_3^* + H_2O \rightarrow Al{-}O{-}Al(OH)^* + xs\ CH_{4(g)}$$

$$Hf{-}O{-}Si(N(CH_3)_2)^* + H_2O \rightarrow Hf{-}O{-}Si(OH)^* + xs\ HN(CH_3)_{2(g)}$$

$$Hf{-}O{-}SiH(N(CH_3)_2)^* + H_2O \rightarrow Hf{-}O{-}SiH(OH)^* + xs\ HN(CH_3)_{2(g)}$$

$$Hf{-}O{-}SiH(N(CH_3)_2)^* + H_2O \rightarrow Hf{-}O{-}Si(OH)^* + xs\ HN(CH_3)_{2(g)} + H_{2(g)}$$

$$Hf{-}O{-}Si(N(CH_3)_2)^* + H_2O \rightarrow Hf{-}O{-}Si(OH)^* + xs\ HN(CH_3)_2(g)$$

$$Hf{-}O{-}Hf(N(CH_2CH_3)_2)^* + H_2O \rightarrow Hf{-}O{-}Hf(OH)^* + xs\ HN(CH_2CH_3)_{2(g)}$$

$$Hf{-}O{-}AlCH_3^* + H_2O \rightarrow Hf{-}O{-}Al(OH)^* + xs\ CH_{4(g)}$$

$$Si{-}O{-}Si(N(CH_3)_2)^* + H_2O \rightarrow Si{-}O{-}Si(OH)^* + xs\ HN(CH_3)_{2(g)}$$

$$Si{-}O{-}SiH(N(CH_3)_2)^* + H_2O \rightarrow Si{-}O{-}SiH(OH)^* + xs\ HN(CH_3)_{2(g)}$$

$$Si{-}O{-}SiH(N(CH_3)_2)^* + H_2O \rightarrow Si{-}O{-}Si(OH)^* + xs\ HN(CH_3)_{2(g)} + H_{2(g)}$$

$$Si{-}O{-}Si(N(CH_3)_2)^* + H_2O \rightarrow Si{-}O{-}Si(OH)^* + xs\ HN(CH_3)_{2(g)}$$

$$Si{-}O{-}Hf(N(CH_2CH_3)_2)^* + H_2O \rightarrow Si{-}O{-}Hf(OH)^* + xs\ HN(CH_2CH_3)_{2(g)}$$

$$Si{-}O{-}AlCH_3^* + H_2O \rightarrow Si{-}O{-}Al(OH)^* + xs\ CH_{4(g)}$$

Reactivity of Surface Products with $NH_{3(g)}$ to Generate Surface Amine (—$NH_2$, —NH) Groups.

$$Al{-}O{-}Si(N(CH_3)_2)^* + NH_3 \rightarrow Al{-}O{-}Si(NH_2)^* + xs\ HN(CH_3)_{2(g)}$$

$$Al{-}O{-}SiH(N(CH_3)_2)^* + NH_3 \rightarrow Al{-}O{-}SiH(NH_2)^* + xs\ HN(CH_3)_{2(g)}$$

$$Al{-}O{-}SiH(N(CH_3)_2)^* + NH_3 \rightarrow Al{-}O{-}Si(NH)^* + xs\ HN(CH_3)_{2(g)} + H_{2(g)}$$

$$Al{-}O{-}Si(N(CH_3)_2)^* + NH_3 \rightarrow Al{-}O{-}Si(NH_2)^* + xs\ HN(CH_3)_{2(g)}$$

$$Al{-}O{-}Hf(N(CH_2CH_3)_2)^* + NH_3 \rightarrow Al{-}O{-}Hf(NH_2)^* + xs\ HN(CH_2CH_3)_{2(g)}$$

Al—O—AlCH₃*+NH₂₍ₚ₎→Al—O—Al(NH₂)*+xs CH₄₍g₎

Hf—O—Si(N(CH₃)₂)*+NH₃→Hf—O—Si(OH)*+xs HN(CH₃)₂₍g₎

Hf—O—SiH(N(CH₃)₂)*+NH₃→Hf—O—SiH(NH)*+xs HN(CH₃)₂₍g₎

Hf—O—SiH(N(CH₃)₂)*+NH₃→Hf—O—Si(NH)*+xs HN(CH₃)₂₍g₎+H₂₍g₎

Hf—O—Si(N(CH₃)₂)*+NH₃→Hf—O—Si(NH)*+xs HN(CH₃)₂₍g₎

Hf—O—Hf(N(CH₂CH₃)₂)*+NH₃→Hf—O—Hf(NH)*+xs HN(CH₂CH₃)₂₍g₎

Hf—O—AlCH₃*+NH₂₍ₚ₎→Hf—O—Al(NH)*+xs CH₄₍g₎

Si—O—Si(N(CH₃)₂)*+NH₃→Si—O—Si(NH)*+xs HN(CH₃)₂₍g₎

Si—O—SiH(N(CH₃)₂)*+NH₃→Si—O—SiH(NH)*+xs HN(CH₃)₂₍g₎+H₂₍g₎

Si—O—SiH(N(CH₃)₂)*+NH₃→Si—O—Si(NH)*+xs HN(CH₃)₂₍g₎+H₂₍g₎

Si—O—Si(N(CH₃)₂)*+NH₃→Si—O—Si(NH)*+xs HN(CH₃)₂₍g₎

Si—O—Hf(N(CH₂CH₃)₂)*+NH₃→Si—O—Hf(NH)*+xs HN(CH₂CH₃)₂₍g₎

Si—O—AlCH₃*+NH₂₍ₚ₎→Si—O—Al(NH)*+xs CH₄₍g₎

Reactivity of Precursors with Surface Amine Groups (—NH or —NH₂)

Hf—NH*+TrisDMAS₍g₎→Hf—N—SiH(N(CH₃)₂)*+xs HN(CH₃)₂₍g₎

Hf—NH*+TrisDMAS₍g₎→Hf—N—Si(N(CH₃)₂)*+xs HN(CH₃)₂₍g₎+H₂₍g₎

Hf—NH*+TDEAH₍g₎→Hf—N—Hf(N(CH₂CH₃)₂)*+xs HN(CH₂CH₃)₂₍g₎

Hf—NH*+TMA₍g₎→Hf—N—AlCH₃*+xs CH₄₍g₎

Si—NH*+TrisDMAS₍g₎→Si—N—SiH(N(CH₃)₂)*+xs HN(CH₃)₂₍g₎

Si—NH*+TrisDMAS₍g₎→Si—N—Si(N(CH₃)₂)*+xs HN(CH₃)₂₍g₎+H₂₍g₎

Si—NH*+TDEAH₍g₎→Si—N—Hf(N(CH₂CH₃)₂)*+xs HN(CH₂CH₃)₂₍g₎

Si—NH*+TMA₍g₎→Si—N—Al(CH₃)*+xs HN(CH₂CH₃)₂₍g₎

Reactivity of Surface products with NH₃ to Regenerate Surface Amine Groups.

Hf—N—SiH(N(CH₃)₂)*+NH₃₍g₎→Hf—N—Si(NH)*+xs HN(CH₃)₂₍g₎+H₂₍g₎

Hf—N—SiH(N(CH₃)₂)*+NH₃₍g₎→Hf—N—SiH(NH₂)*+xs HN(CH₃)₂₍g₎

Hf—N—Si(N(CH₃)₂)*+NH₃₍g₎→Hf—N—Si(NH₂)*+xs HN(CH₃)₂₍g₎

Hf—N—Hf(N(CH₂CH₃)₂)*+NH₃₍g₎→Hf—N—Hf(NH₂)*+xs HN(CH₂CH₃)₂₍g₎

Hf—N—AlCH₃*+NH₂₍ₚ₎→Hf—N—Al(NH₂)*+xs HN(CH₃)₂₍g₎

Hf—N—SiH(N(CH₃)₂)*+NH₃₍g₎→Si—N—Si(NH)*+xs HN(CH₃)₂₍g₎+H₂₍g₎

Hf—N—SiH(N(CH₃)₂)*+NH₃₍g₎→Si—N—SiH(NH₂)*+xs HN(CH₃)₂₍g₎

Si—N—Si(N(CH₃)₂)*+NH₃₍g₎→Si—N—Si(NH₂)*+xs HN(CH₃)₂₍g₎

Si—N—Hf(N(CH₂CH₃)₂)*+NH₃₍g₎→Si—N—Hf(NH₂)*+xs HN(CH₂CH₃)₂₍g₎

Si—N—Al(CH₃)*+NH₂₍ₚ₎→Si—N—Al(NH₂)*+xs HN(CH₂CH₃)₂₍g₎

Reactivity of Surface Products with H₂O₍g₎ to Generate Surface Hydroxyl Groups

Hf—N—SiH(N(CH₃)₂)*+H₂O→Hf—N—Si(OH)*+xs HN(CH₃)₂₍g₎+H₂₍g₎

Hf—N—SiH(N(CH₃)₂)*+H₂O→Hf—N—SiH(OH)*+xs HN(CH₃)₂₍g₎

Hf—N—Si(N(CH₃)₂)*+H₂O→Hf—N—Si(OH)*+xs HN(CH₃)₂₍g₎

Hf—N—Hf(N(CH₂CH₃)₂)*H₂O→Hf—N—Hf(OH)*+xs HN(CH₂CH₃)₂₍g₎

Hf—N—AlCH₃*+H₂O→Hf—N—Al(OH)*+xs CH₄₍g₎

Si—N—SiH(N(CH₃)₂)*+H₂O→Si—N—Si(OH)*+xs HN(CH₃)₂₍g₎+H₂₍g₎

Si—N—SiH(N(CH₃)₂)*+H₂O→Si—N—SiH(OH)*+xs HN(CH₃)₂₍g₎

Si—N—Si(N(CH₃)₂)*+H₂O→Si—N—Si(OH)*+xs HN(CH₃)₂₍g₎

Si—N—Hf(N(CH₂CH₃)₂)*+H₂O→Si—N—Hf(OH)*+xs HN(CH₂CH₃)₂₍g₎

Si—N—Al(CH₃)*+H₂O→Si—N—Al(OH)*+xs HN(CH₂CH₃)₂₍g₎

EXAMPLES

TDEAH=tetrakisdiethylamidohafnium=(Et₂N)₄Hf
TDMAS=tetrakisdimethlaminosilicon=(Me₂N)₄Si
TrisDMAS=trisdimethylaminosilicon=(Me₂N)₃SiH
TMA=trimethyl aluminum=Me₃Al The ALD processes are maintained in a temperature range from about 20° C. to about 650° C., preferably from about 150° C. to about 300° C., more preferably at about 225° C. Materials grown may be similar throughout a wider temperature range assuming that saturating ALD behavior is maintained. The ALD processes are conducted with a pressure in the range from about 0.1 Torr to about 100 Torr, preferably in the range from about 1 Torr to about 10 Torr. Materials grown may be similar from high vacuum to high pressures assuming saturating ALD behavior is maintained. The flow is maintained viscous to encourage reactant separation. Carrier gas (e.g., N₂) is maintained in the range from about 50 sccm to about 1,000 sccm, preferably at about 300 sccm with a speed of about 1 m/s. Higher speeds may create particle transport issues while lower speeds could allow particle formation due to inefficient purging, affecting electrical behavior of thin films. Films are deposited with thickness in the range from about 2 Å to about 1,000 Å, preferably, from about 5 Å to about 100 Å, and more preferably in the range from about 10 Å to about 50 Å.

In one example, a hafnium oxide film is grown by ALD in the presence of hydrogen gas. Hydrogen is used to reduce levels of halogen contaminates (e.g., F or Cl) within hafnium-containing films. Flow A, containing hafnium tetrachloride and at least one carrier gas (e.g., Ar, $N_2$ and $H_2$), is pulsed sequentially with Flow B, containing water, hydrogen and an optional carrier gas. Flows A and B are each pulsed for about 1 second and purge flows of argon are pulsed for about 1 second between each pulse of Flows A and B. The temperature is maintained in the range from about 250° C. to about 650° C.

In another example, a hafnium silicate film is grown by ALD in the presence of hydrogen gas. Flow A, containing hafnium tetrachloride and at least one carrier gas (e.g., Ar, $N_2$ and $H_2$), is pulsed sequentially with Flow B, containing water, hydrogen and an optional carrier gas and Flow C, containing Tris-DMAS and at least one carrier gas. Flows A, B and C are each pulsed for about 1 second and purge flows of argon are pulsed for about 1 second between each pulse of Flows A, B and C. The temperature is maintained in the range from about 450° C. to about 650° C.

In another example, a hafnium silicon oxynitride film is grown by ALD in the presence of hydrogen gas. Flow A, containing hafnium tetrachloride and at least one carrier gas (e.g., Ar, $N_2$ and $H_2$), is pulsed sequentially with Flow B, containing water, hydrogen and an optional carrier gas and Flow C, containing Tris-DMAS and at least one carrier gas and Flow D, containing a nitrogen plasma and an optional carrier gas. Flows A, B, C and D are each pulsed for about 1 second and purge flows of argon are pulsed for about 1 second between each pulse of Flows A, B, C and D. The temperature is maintained in the range from about 450° C. to about 650° C.

Materials are deposited by dosing chemicals separately in an alternating fashion to achieve the desired film composition or characteristics with selected half reactions. The above half reactions, however, do not dictate the exact bonding connectivity or the stoichiometry of the resulting film. Stoichiometry is largely controlled by thermodynamics; however, kinetically controlled films may be achieved. Thus, the dosing sequence may be modified to effect the overall composition and qualities of the film. The types of thin-film materials that can be grown with ALD half reactions generally are:

1. Binary Materials: Repetitive cycles of reactants {A+B}: e.g., $Hf_3N_4$
2. Direct Alloys: Repetitive cycles of reactants {A+B+C+D}: e.g., $HfSiO_4$
3. Compositionally Controlled Alloys: Repetitive cycles of reactants {y(A+B)+z(C+D)} (where either y or z=1 and either z or y is >1, respectively): e.g., $Hf_xSi_{(2-x)}O_4$
4. Compositionally Controlled Gradient Materials: Similar to 3, however, y or z is varied during deposition.
5. Layered or laminate materials: Deposition of two different materials in discrete physical layers. Repetitive cycles of reactants {y(A+B+C+D)+z(E+F)} (where y and z are typically $\geqq 4$): e.g., nanolaminates of hafnia and alumina ALD of hafnium aluminates ($Hf_xAl_yO$)
Direct: 1 cycle=(TDEAH+$H_2O$+TMA+$H_2O$)
half reactions(s)=4.03+5.03+4.08+5.08

Compositionally Controlled: 1 cycle=n(TDEAH+$H_2O$)+m (TMA+$H_2O$) where typically n is one and m is varied or m is one and n is varied.
half reactions (second) (e.g., n=3, m=1)=4.03+5.03+4.07+5.07+4.07+5.07+4.08+5.08
Layered: 1 layer=p(TDEAH+$H_2O$)+q(TMA+$H_2O$) where p and q are typically$\geqq 4$
half reactions (second) (e.g., n=4, m=4)=4.03+5.03+(4.07+5.07+4.07+5.07+4.07+5.07)+4.08+5.08+(4.04+5.04+4.04+5.05+4.04+5.04)

ALD of hafnium nitrides ($Hf_3N_4$ or HfN)
Direct: 1 cycle=(TDEAH+$NH_3$).
half reactions (second)=7.02+8.02

In this case, deposition at these temperatures may produce $Hf_3N_4$. Annealing to higher temperatures may produce HfN.

ALD of hafnium oxynitrides ($HfO_xN_y$)
Direct: 1 cycle=(TDEAH+$H_2O$+TDEAH+$NH_3$)
half reactions (second)=7.02+9.02+4.07+6.07
Compositionally Controlled: 1 cycle=n(TDEAH+$H_2O$)+m (TDEAH+$NH_3$) where typically n is one and m is varied or m is one and n is varied.
Layered: 1 layer=p(TDEAH+$H_2O$)+q(TDEAH+$NH_3$) where p and q are typically$\geqq 4$ ALD of hafnium aluminum oxynitrides ($Hf_wAl_xO_yN_z$)
Direct: 1 cycle=(TDEAH+$NH_3$+TMA+$H_2O$) hafnium oxynitride/alumina oxynitride alloy
Variations possible: 1 cycle=(TDEAH+$NH_3$+TDEAH+$H_2O$+TMA+$H_2O$)

Note: The different dosing sequence effects the bonding connectivity, especially when grown at lower temperatures <300° C. and without a higher-temperature anneal. In the top example, one might predict —O—Hf—N—Al—O— connectivity. This may be thought of as a hafnium oxynitride/aluminum oxynitride alloy. In the bottom example, one might predict —O—Hf—N—Hf—O—Al—O— connectivity. This may be thought of as a hafnium oxynitride/alumina alloy.

ALD of hafnium silicates ($HfSiO_4$ and $Hf_xSi_yO$)
Direct: 1 cycle=(TDEAH+$H_2O$+TrisDMAS+$H_2O$)=$HfSiO_4$
Silica-rich hafnium silicates: 1 cycle=(TDEAH+$H_2O$)+3 (TrisDMAS+$H_2O$)=$Hf_2Si_5O_{14}$ Compositional control (Hf:Si) from pure $HfO_2$ to silica-rich (>70%) hafnium silicates are possible.

ALD of aluminum silicate ($Al_6Si_2O_{13}$ and $Al_xSi_yO$)
Direct: 1 cycle=(TMA+$H_2O$+TrisDMAS+$H_2O$)=$Al_6Si_2O_{13}$
Silica-rich aluminum silicates: 1 cycle=(TMA+$H_2O$)+3 (TrisDMAS+$H_2O$)=$Al_2Si_2O_7$ Compositional control (Al:Si) from pure $Al_2O_3$ to silica-rich (>50%) aluminum silicates are possible.

ALD of hafnium aluminum silicate ($Hf_2Al_6Si_4O_{21}$ and $Hf_xAl_ySi_zO$)
e.g., 1 cycle=(TDEAH+$H_2O$+TrisDMAS+$H_2O$+TMA+$H_2O$+TrisDMAS+$H_2O$)=$Hf_2Al_6Si_4O_{21}$ ALD of hafnium silicon nitride ($Hf_xSi_yN$)
Direct: 1 cycle =(TDEAH+$NH_3$+TrisDMAS+$NH_3$)

ALD of hafnium silicon oxynitride ($HfSi_xO_yN_z$)
e.g., (TDEAH+$H_2O$+TrisDMAS+$NH_3$)
e.g., (TDEAH+$NH_3$+TDEAH+$H_2O$+TrisDMAS+$H_2O$+TrisDMAS+$NH_3$)

ALD of aluminum silicon oxynitride ($AlSi_xO_yN_z$)
e.g., ($TMA+H_2O+TrisDMAS+NH_3$)

ALD of hafnium aluminum silicon oxynitride ($HfAl_wSi_xO_yN_z$)
e.g., ($TDEAH+NH_3+TMA+H_2O+TrisDMAS+H_2O$)
e.g., ($TDEAH+NH_3+TDEAH+H_2O+TrisDMAS+NH_3+TMA+H_2O$)

Continuous ALD of silica ($SiO_2$)
e.g., Direct: 1 cycle=$Si(NCO)_4+H_2O$
  This process may allow laminate layers of pure $SiO_2$ or more easy control of Si concentration in mixed allows. $Si(NCO)_4$ is very reactive with Hf—OH* groups making silica incorporation easy (since TDEAH is reactive with SiOH*).
e.g., Consider several ($TrisDMAS+H_2O$) cycles with an occasional ($TDEAH+H_2O$) or ($TMA+H_2O$) cycle or (flash anneal >700° C.+$H_2O$) to reform surface hydroxal groups to reinitiate growth.

$Si_3N_4$, (e.g. Non-Continuous Seed Layer or Capping Layer)
e.g., Direct: 1 cycle=($TrisDMAS+NH_3$)

$Si_xO_yN$, (e.g., Non-Continuous Seed Layer or Capping Layer)
e.g., Direct: 1 cycle=($TrisDMAS+NH_3+TrisDMAS+H_2O$)

AlN
e.g., 1 cycle=($TMA+NH_3$)
$Al_xSi_yN$:
$Al_xO_yN$:
$Hf_xAl_yN$:

While the foregoing is directed to embodiments of the present invention, other and further embodiments of the invention may be devised without departing from the basic scope thereof, and the scope thereof is determined by the claims that follow.

What is claimed is:

1. A composition of a semiconductor material, comprising:
    a film comprising a plurality of layers and having the chemical formula of $HfSi_xO_yN_z$,
        wherein x is at least about 0.2 and less than about 4;
        y is at least about 0.5 and less than about 4;
        z is at least about 0.05 and less than 2; and wherein the plurality of layers comprises:
            a first hafnium layer;
            a first nitrogen layer disposed on the first hafnium layer;
            a first silicon layer disposed on the first nitrogen layer; and
            a first oxygen layer disposed on the first silicon layer.

2. The composition of claim 1, wherein the film has a thickness within a range from about 2 Å to about 1,000 Å.

3. The composition of claim 2, wherein the thickness is within a range from about 10 Å to about 50 Å.

4. The composition of claim 1, further comprising:
    a first aluminum layer disposed on the first oxygen layer.

5. The composition of claim 1, further comprising:
    a second hafnium layer disposed over the first oxygen layer;
    a second nitrogen layer disposed on the second hafnium layer;
    a second silicon layer disposed on the second nitrogen layer; and
    a second oxygen layer disposed on the second silicon layer.

6. A composition of a semiconductor material, comprising:
    a film comprising a plurality of layers and having the chemical formula of $HfSi_xO_yN_z$,
        wherein x is at least about 0.2 and less than about 4;
        y is at least about 0.5 and less than about 4;
        z is at least about 0.05 and less than 2; and wherein the plurality of layers comprises:
            a first hafnium layer;
            a first oxygen layer disposed on the first hafnium layer;
            a first nitrogen layer disposed on the first oxygen layer; and
            a first silicon layer disposed on the first nitrogen layer.

7. The composition of claim 6, further comprising: a first aluminum layer disposed on the first silicon layer.

8. The composition of claim 6, further comprising:
    a second hafnium layer disposed on the first silicon layer;
    a second oxygen layer disposed on the second hafnium layer;
    a second nitrogen layer disposed on the second oxygen layer; and
    a second silicon layer disposed on the second nitrogen layer.

9. The composition of claim 6, wherein the film has a thickness within a range from about 2 Å to about 1,000 Å.

10. The composition of claim 9, wherein the thickness is within a range from about 10 Å to about 50 Å.

11. A composition of a semiconductor material, comprising:
    a film comprising a plurality of layers and having the chemical formula of $HfSI_xO_yN_z$,
        wherein x is at least about 0.2 and less than about 4;
        y is at least about 0.5 and less than about 4;
        z is at least about 0.05 and less than 2; and wherein the plurality of layers comprises:
            a first hafnium layer;
            a first silicon layer disposed on the first hafnium layer;
            a first oxygen layer disposed on the first silicon layer; and
            a first nitrogen layer disposed on the first oxygen layer.

12. The composition of claim 11, further comprising:
a first aluminum layer disposed on the first nitrogen layer.

13. The composition of claim 11, further comprising:
a second hafnium layer disposed on the first nitrogen layer;
a second silicon layer disposed on the second hafnium layer;
a second oxygen layer disposed on the second silicon layer; and
a second nitrogen layer disposed on the second oxygen layer.

14. The composition of claim 11, wherein the film has a thickness within a range from about 2 Å to about 1,000 Å.

15. The composition of claim 14, wherein the thickness is within a range from about 10 Å to about 50 Å.

* * * * *

UNITED STATES PATENT AND TRADEMARK OFFICE
CERTIFICATE OF CORRECTION

PATENT NO. : 7,547,952 B2
APPLICATION NO. : 11/420928
DATED : June 16, 2009
INVENTOR(S) : Metzner et al.

Page 1 of 1

It is certified that error appears in the above-identified patent and that said Letters Patent is hereby corrected as shown below:

Column 8, Line 6, please delete "$(Me_5C_5)_2$  $HfCl_2$" and insert --$(Me_5C_5)_2HfCl_2$-- therefor;

Column 11, Line 23, please delete "+ $H_{2(g)}$" therefor.

Signed and Sealed this

Eighteenth Day of August, 2009

David J. Kappos
*Director of the United States Patent and Trademark Office*